(12) United States Patent
Ueta et al.

(10) Patent No.: US 11,132,329 B2
(45) Date of Patent: Sep. 28, 2021

(54) ELECTRONIC CONTROL DEVICE AND METHOD OF CONTROLLING LOGIC CIRCUIT

(71) Applicant: HITACHI AUTOMOTIVE SYSTEMS, LTD., Ibaraki (JP)

(72) Inventors: Taisuke Ueta, Tokyo (JP); Satoshi Tsutsumi, Tokyo (JP); Hideki Endo, Tokyo (JP); Hideyuki Sakamoto, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/606,830

(22) PCT Filed: Mar. 22, 2018

(86) PCT No.: PCT/JP2018/011517
§ 371 (c)(1),
(2) Date: Oct. 21, 2019

(87) PCT Pub. No.: WO2018/198616
PCT Pub. Date: Nov. 1, 2018

(65) Prior Publication Data
US 2020/0050580 A1 Feb. 13, 2020

(30) Foreign Application Priority Data

Apr. 24, 2017 (JP) .............................. JP2017-085365

(51) Int. Cl.
*G06F 9/30* (2018.01)
*G06F 15/78* (2006.01)
*G05D 1/00* (2006.01)

(52) U.S. Cl.
CPC ...... *G06F 15/7882* (2013.01); *G06F 9/30076* (2013.01); *G05D 1/0088* (2013.01)

(58) Field of Classification Search
None
See application file for complete search history.

(56) References Cited

U.S. PATENT DOCUMENTS

2002/0103839 A1    8/2002  Ozawa
2007/0198971 A1*   8/2007  Dasu ...................... G06F 30/30
                                                   717/140

(Continued)

FOREIGN PATENT DOCUMENTS

JP    2002-215603 A     8/2002
JP    2006-333496 A    12/2006
JP    2007-228052 A     9/2007

OTHER PUBLICATIONS

International Search Report of PCT/JP2018/011517 dated Jun. 26, 2018.

*Primary Examiner* — Michael Sun
(74) *Attorney, Agent, or Firm* — Mattingly & Malur, PC

(57) ABSTRACT

An electronic control device includes: a partially reconfigurable logic circuit in which a calculation unit which is reconfigured and executes calculation and a storage unit which stores calculation target date to be calculated by the calculation unit is configured; and a processing control unit which transmits circuit data for reconfiguring the calculation unit and the calculation target date to the logic circuit. When the processing control unit obtains next calculation target data which is the calculation target date relating to a next calculation unit which is the calculation unit after completion of reconfiguration, transmission of the next calculation target date to the storage unit is started regardless of whether the reconfiguration of the next calculation unit is completed, and upon completion of the reconfiguration, the next calculation unit performs calculation using the next calculation target date.

15 Claims, 17 Drawing Sheets

(56) References Cited

U.S. PATENT DOCUMENTS

| | | | |
|---|---|---|---|
| 2014/0244981 A1* | 8/2014 | Okada | G06F 15/7867 |
| | | | 712/220 |
| 2016/0025497 A1* | 1/2016 | Baalu | H04L 67/12 |
| | | | 701/430 |
| 2016/0050369 A1* | 2/2016 | Takenaka | G06K 9/6215 |
| | | | 348/222.1 |
| 2019/0042127 A1* | 2/2019 | Weber | G06F 12/0875 |
| 2019/0376799 A1* | 12/2019 | Inada | G06F 15/78 |
| 2020/0097470 A1* | 3/2020 | Chambeyron | G06F 16/24561 |

\* cited by examiner

[FIG. 1]
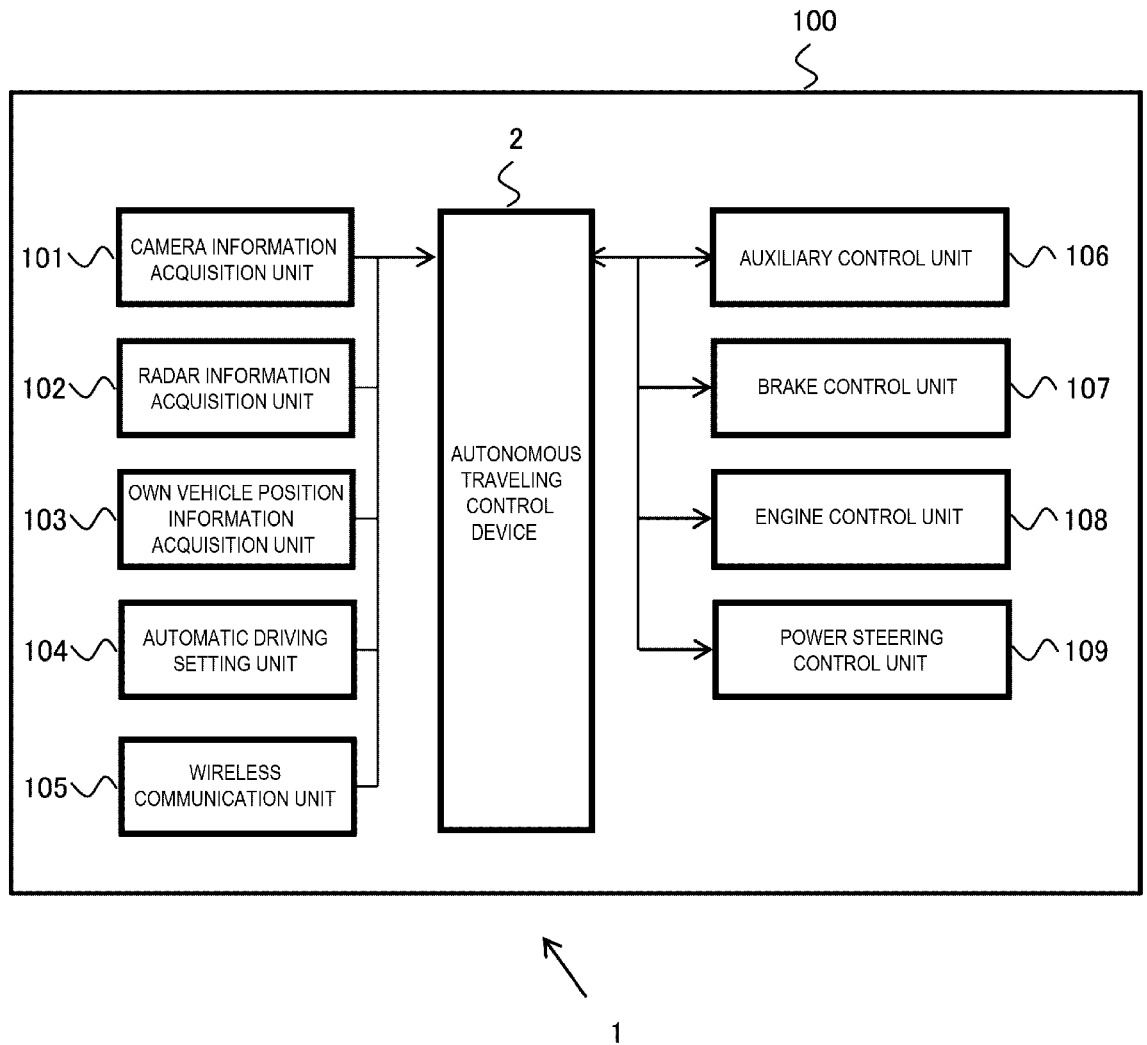

[FIG. 2]
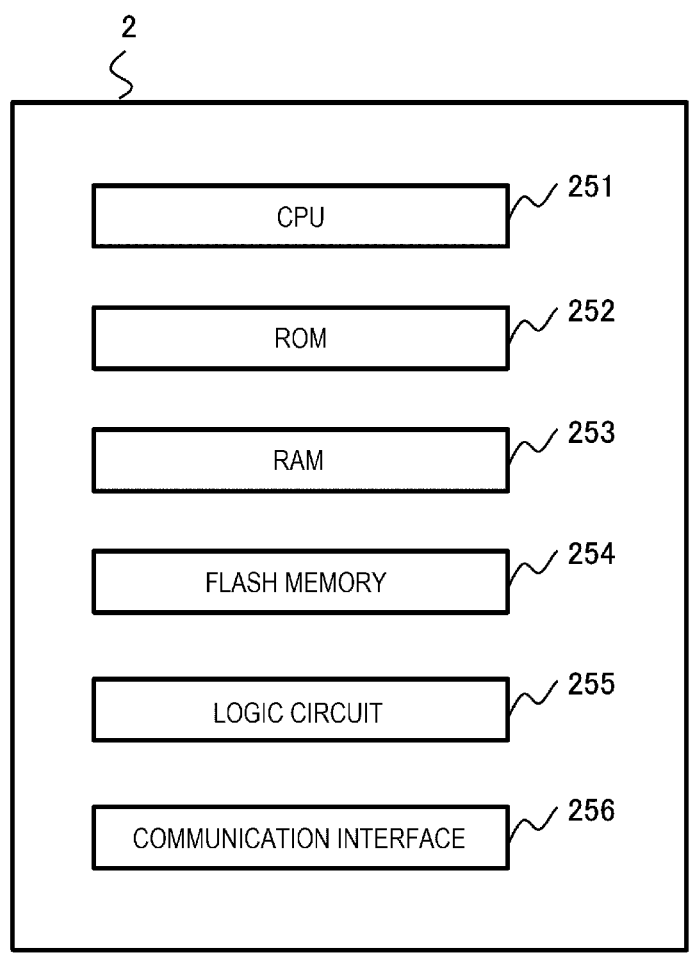

[FIG. 3]
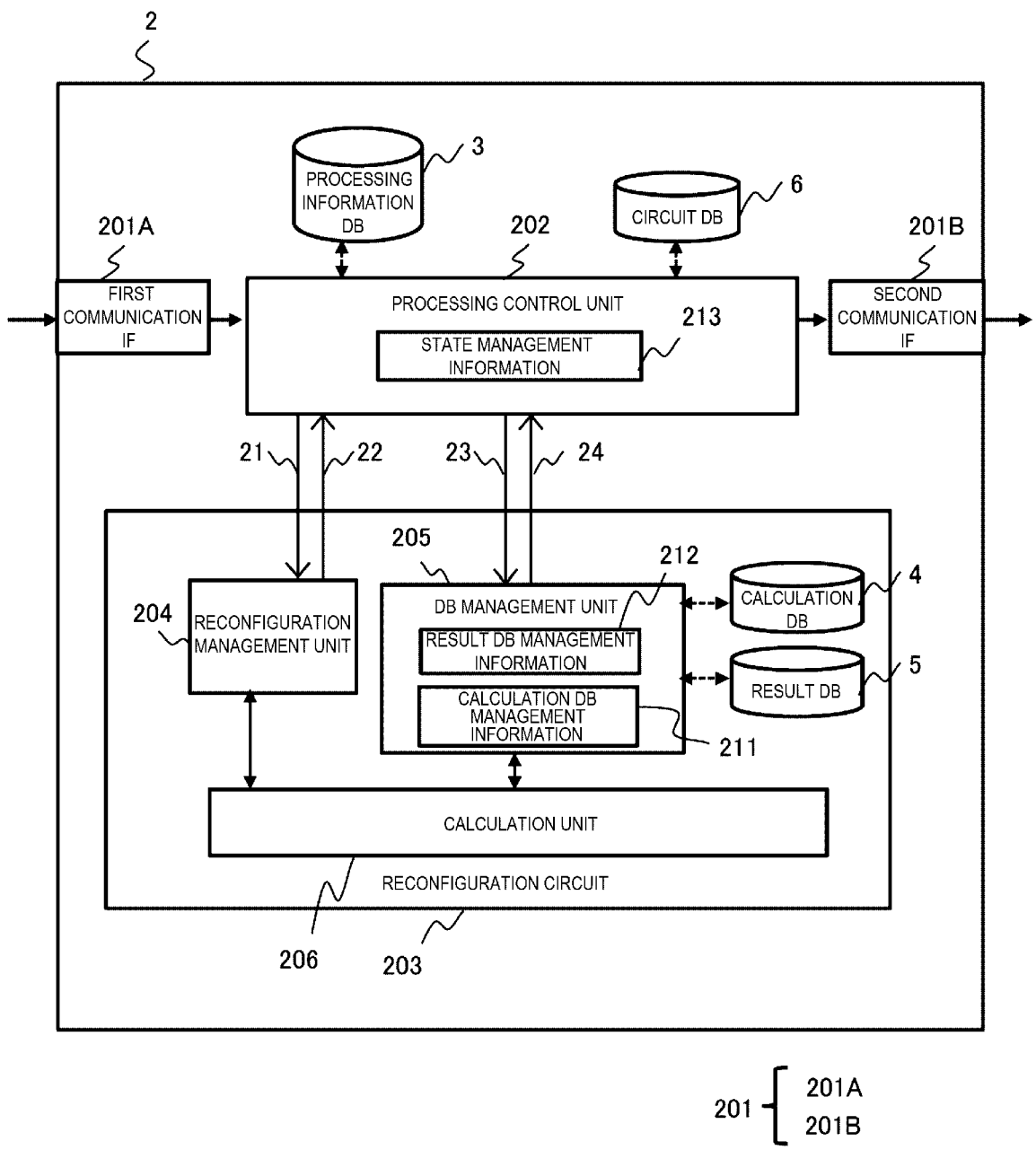

[FIG. 4]
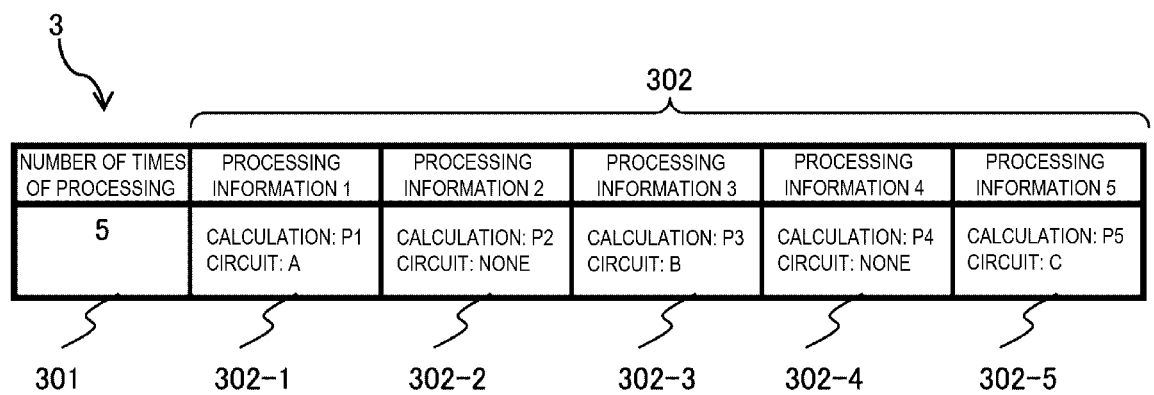

[FIG. 5]

| CIRCUIT TYPE | TOTAL NUMBER OF CALCULATION DATA | SIZE OF ONE CALCULATION DATA | NUMBER OF WRITE DATA | NUMBER OF READ DATA |
|---|---|---|---|---|
| A | 1024 | 8Byte | 512 | 0 |

401, 402, 403, 404, 405

211

[FIG. 6]
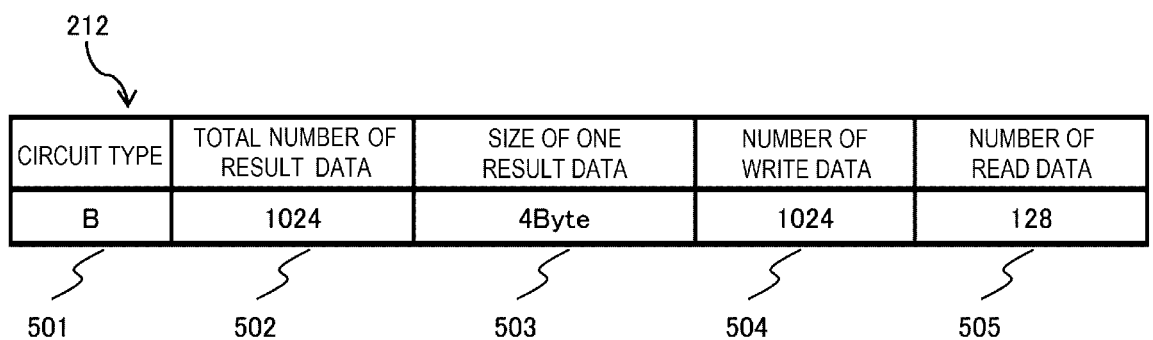

[FIG. 7]

| CALCULATION UNIT | | CALCULATION DB | | RESULT DB | |
|---|---|---|---|---|---|
| CIRCUIT TYPE | RECONFIGURATION STATE | CALCULATION TYPE | CALCULATION DB STATE | RESULT TYPE | RESULT DB STATE |
| C | COMPLETED | C | IN STORAGE | B | ACQUIRED |

213

601  602  603  604  605  606

[FIG. 8]
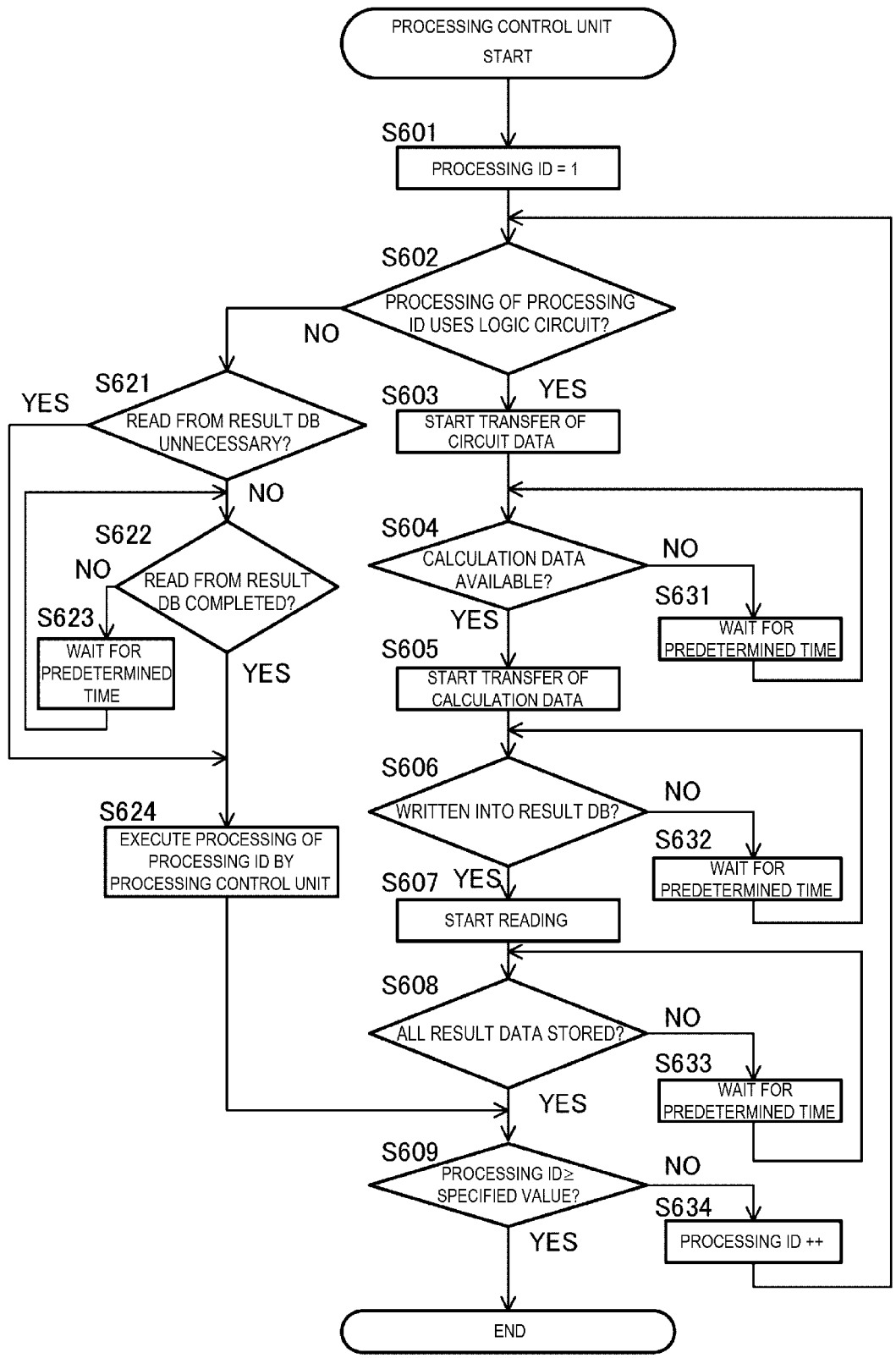

[FIG. 9]
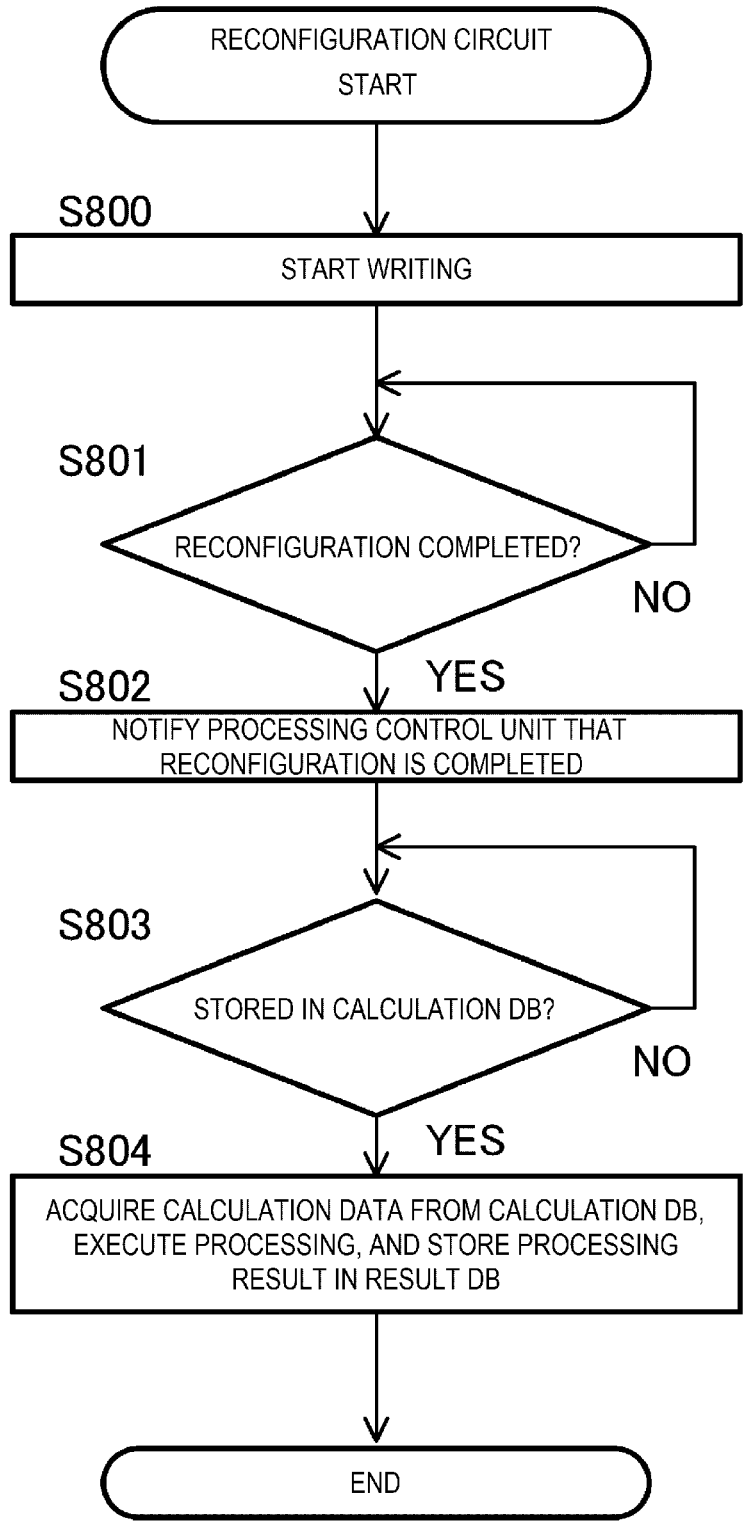

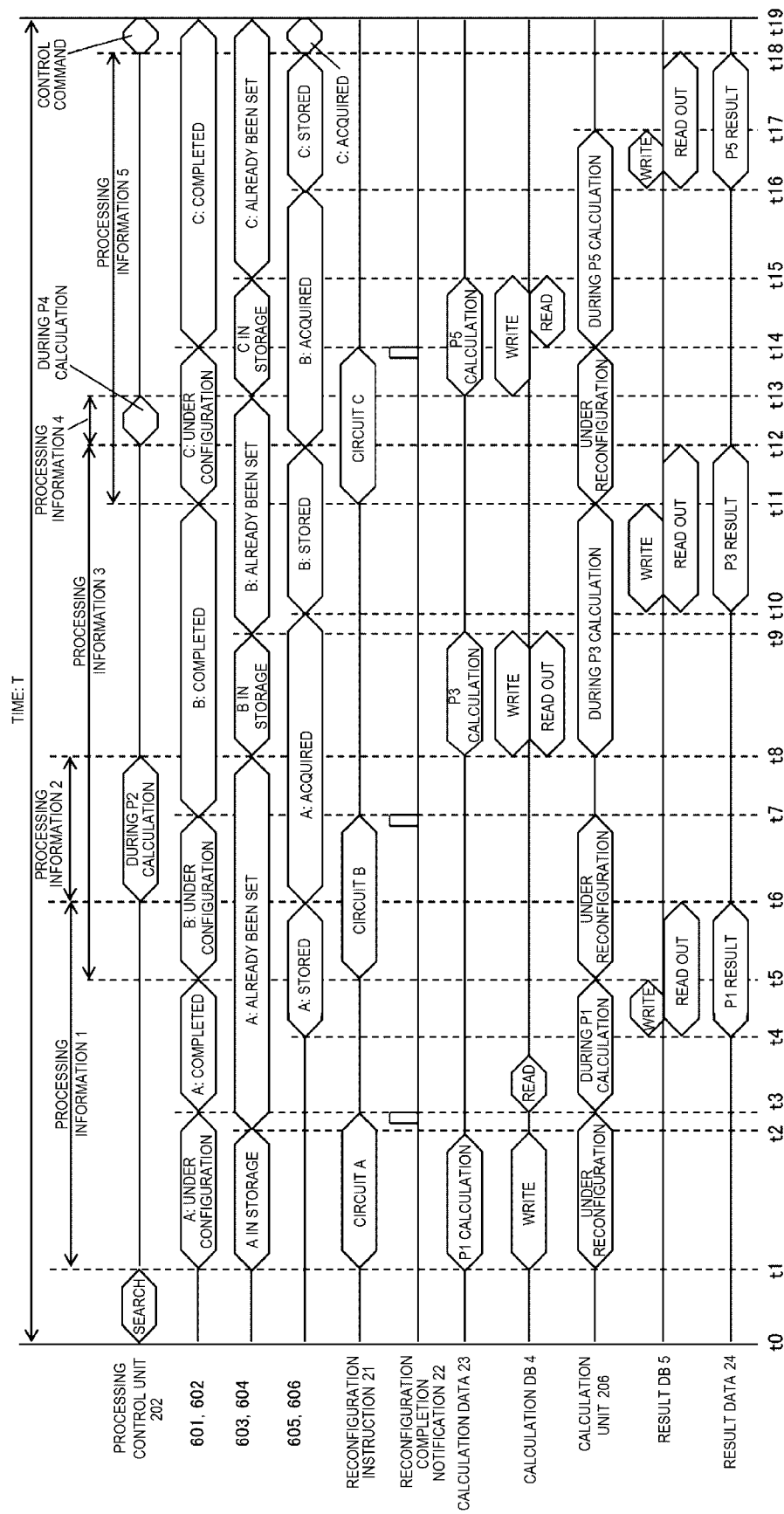
[FIG. 10]

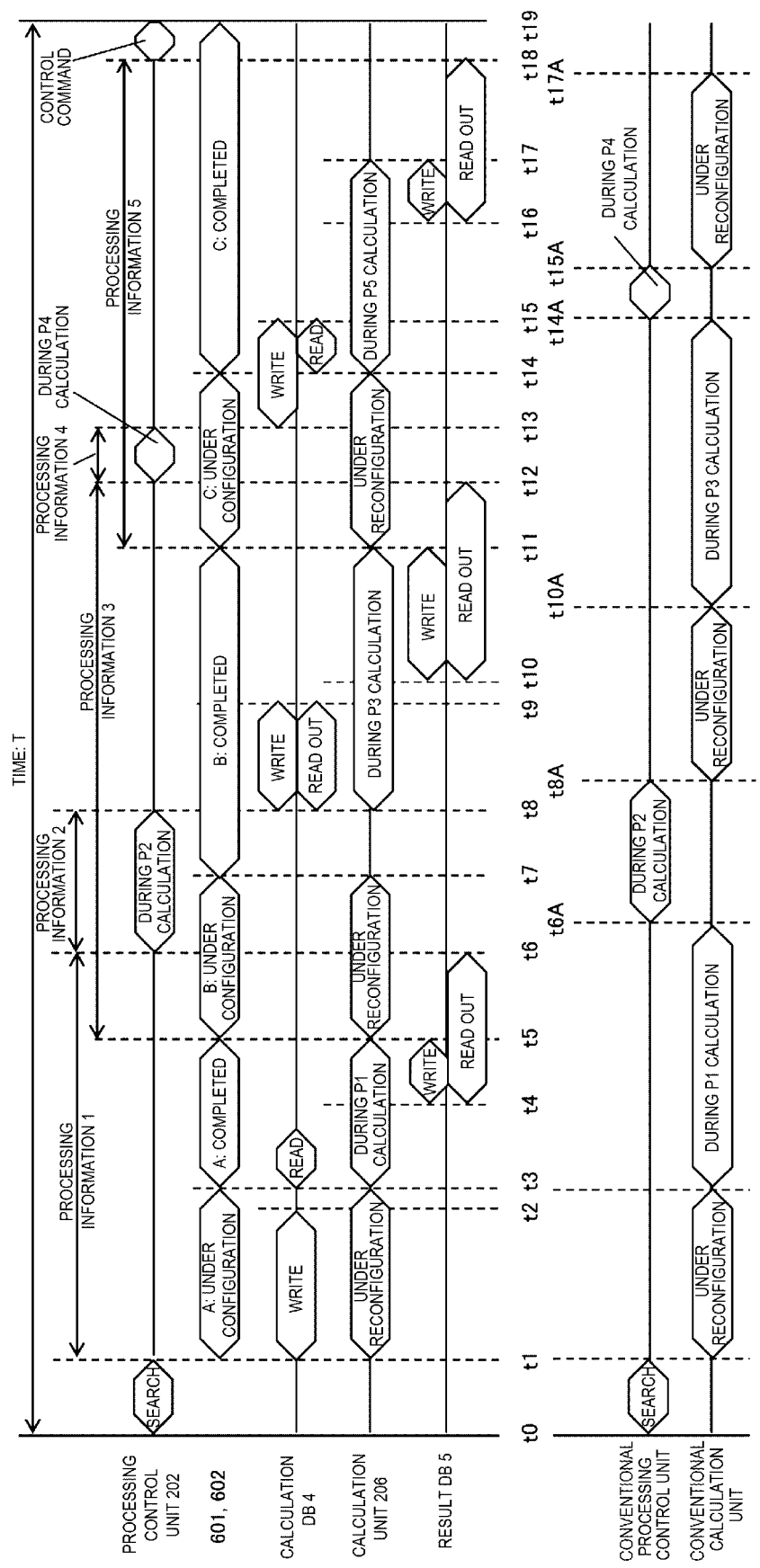
[FIG. 11]

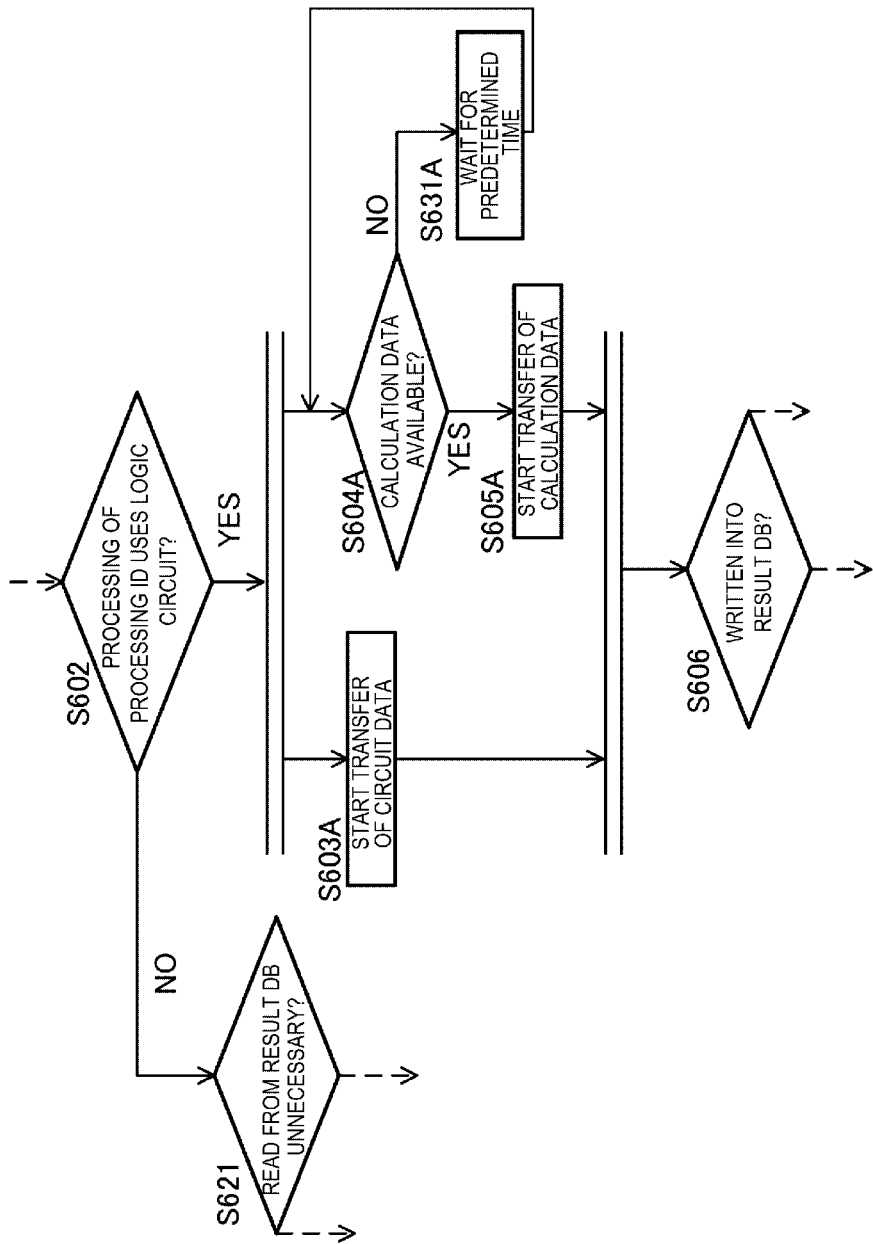
[FIG. 12]

[FIG. 13]
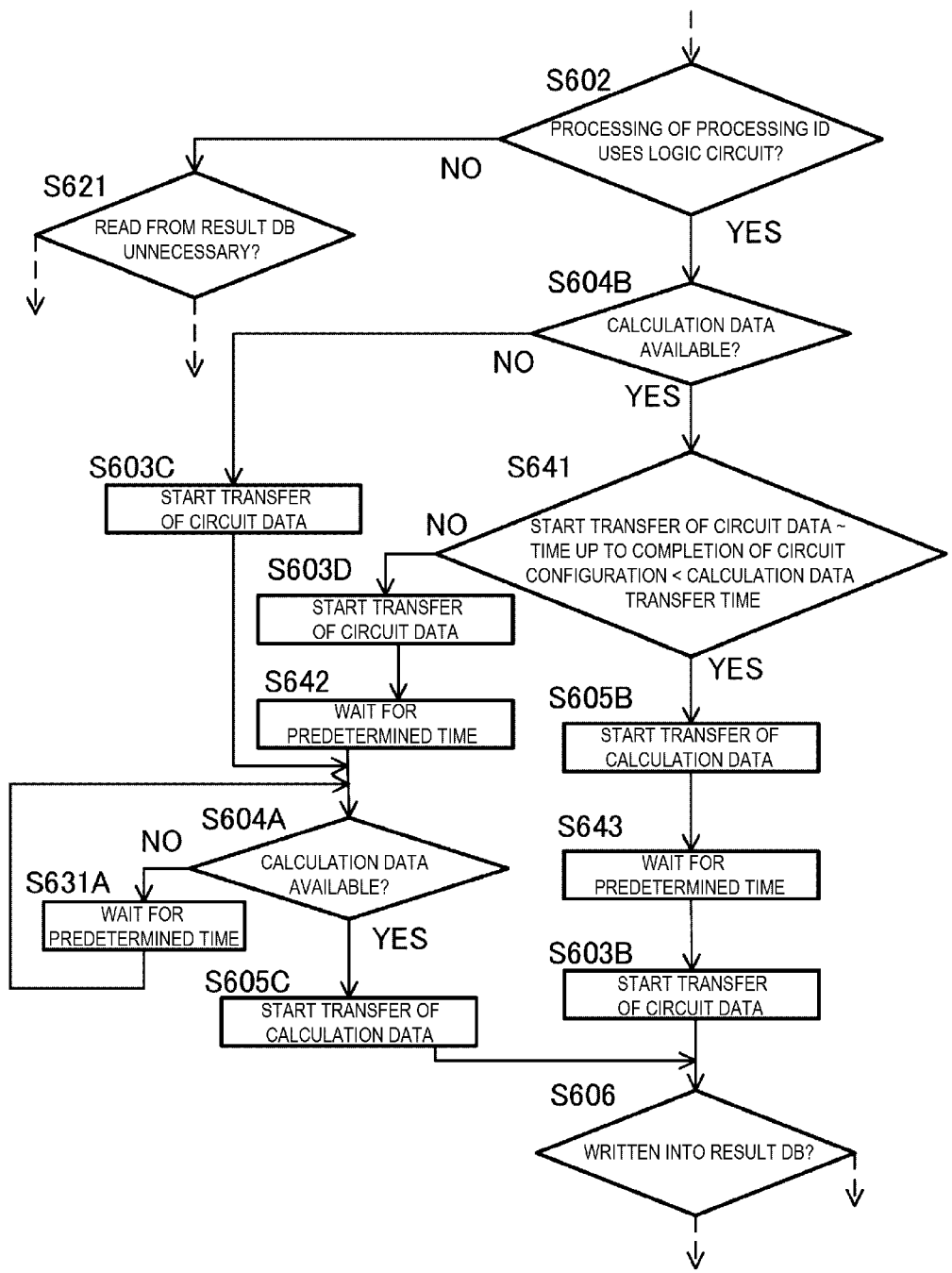

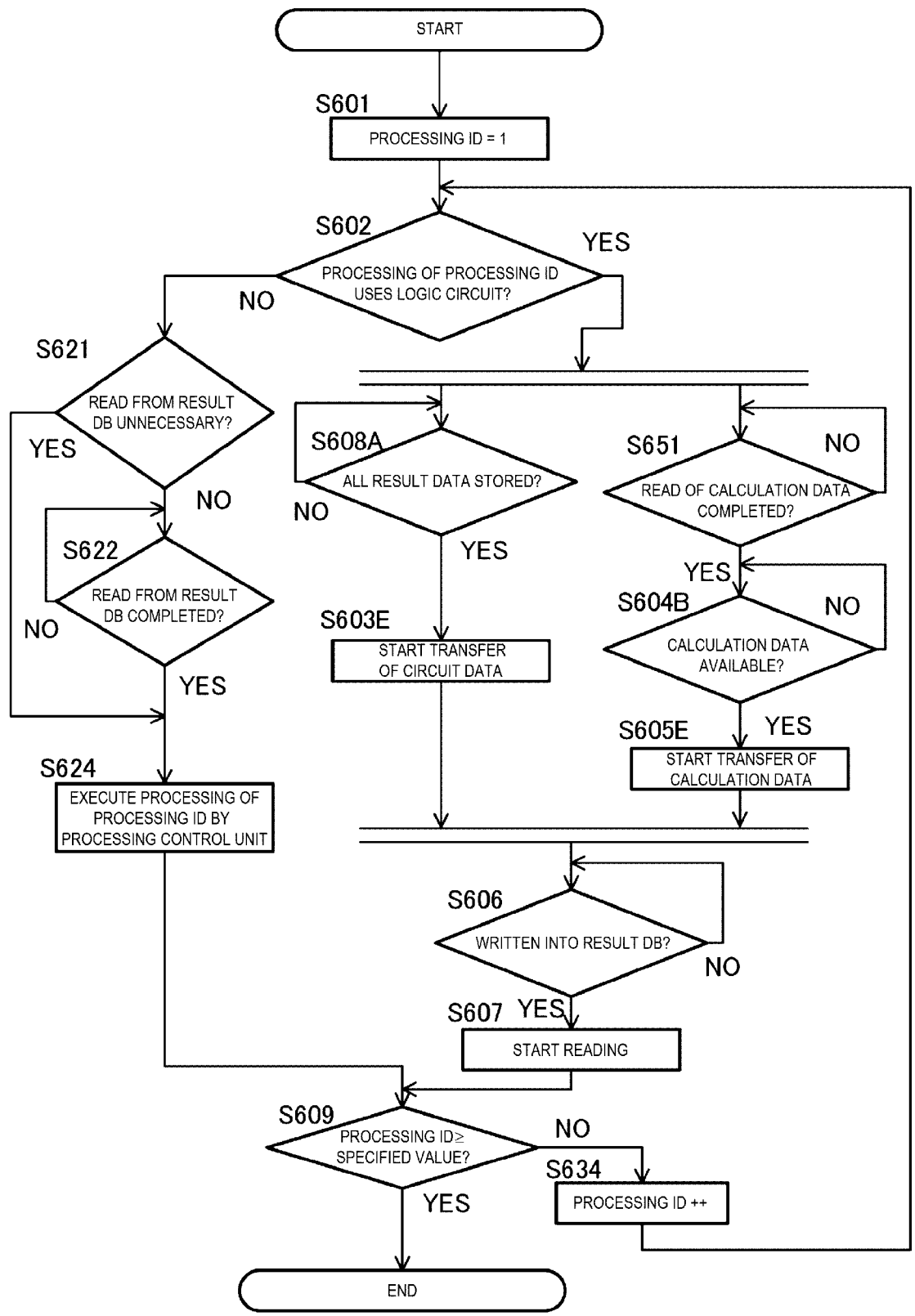
[FIG. 14]

[FIG. 15]
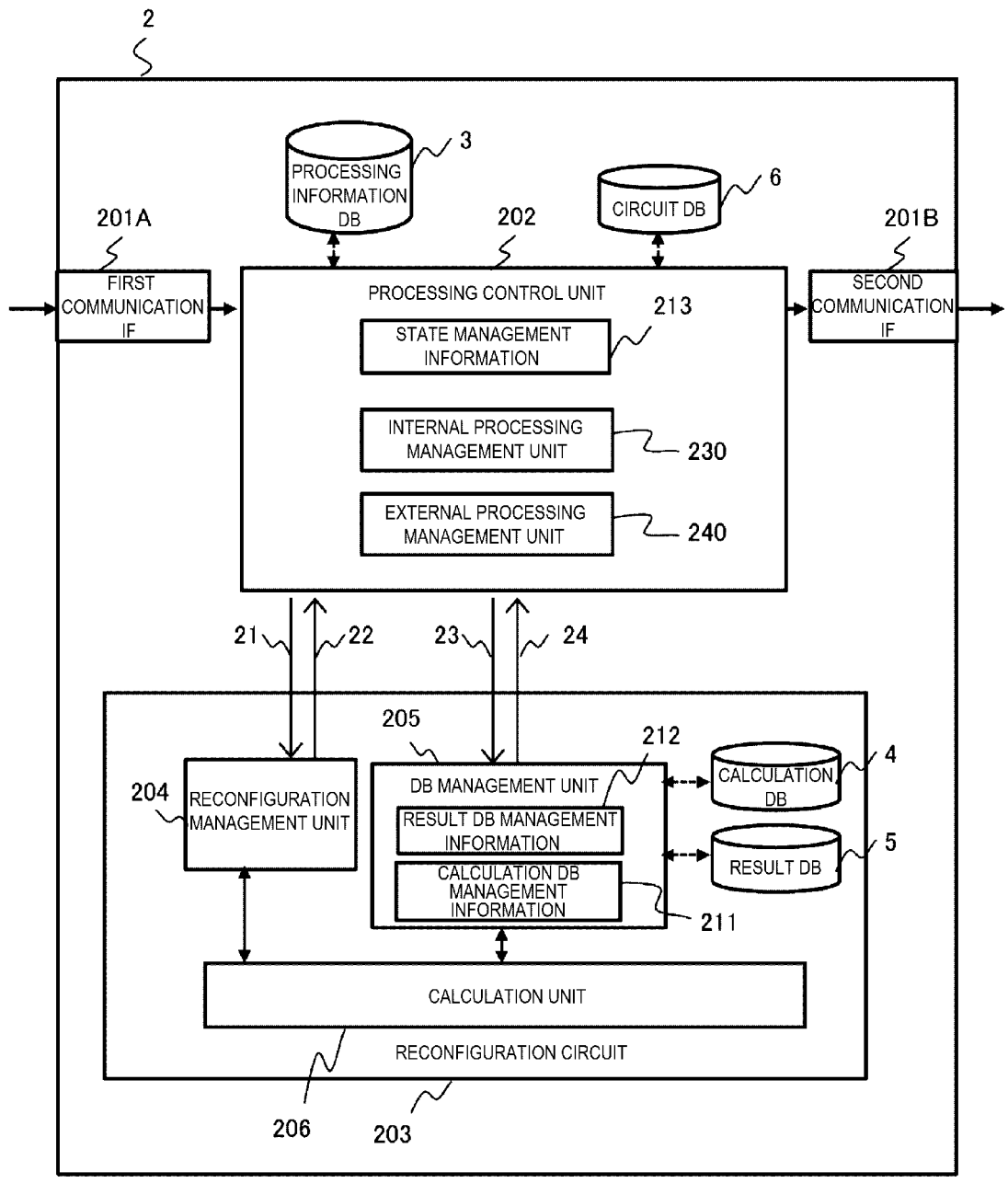

[FIG. 16]
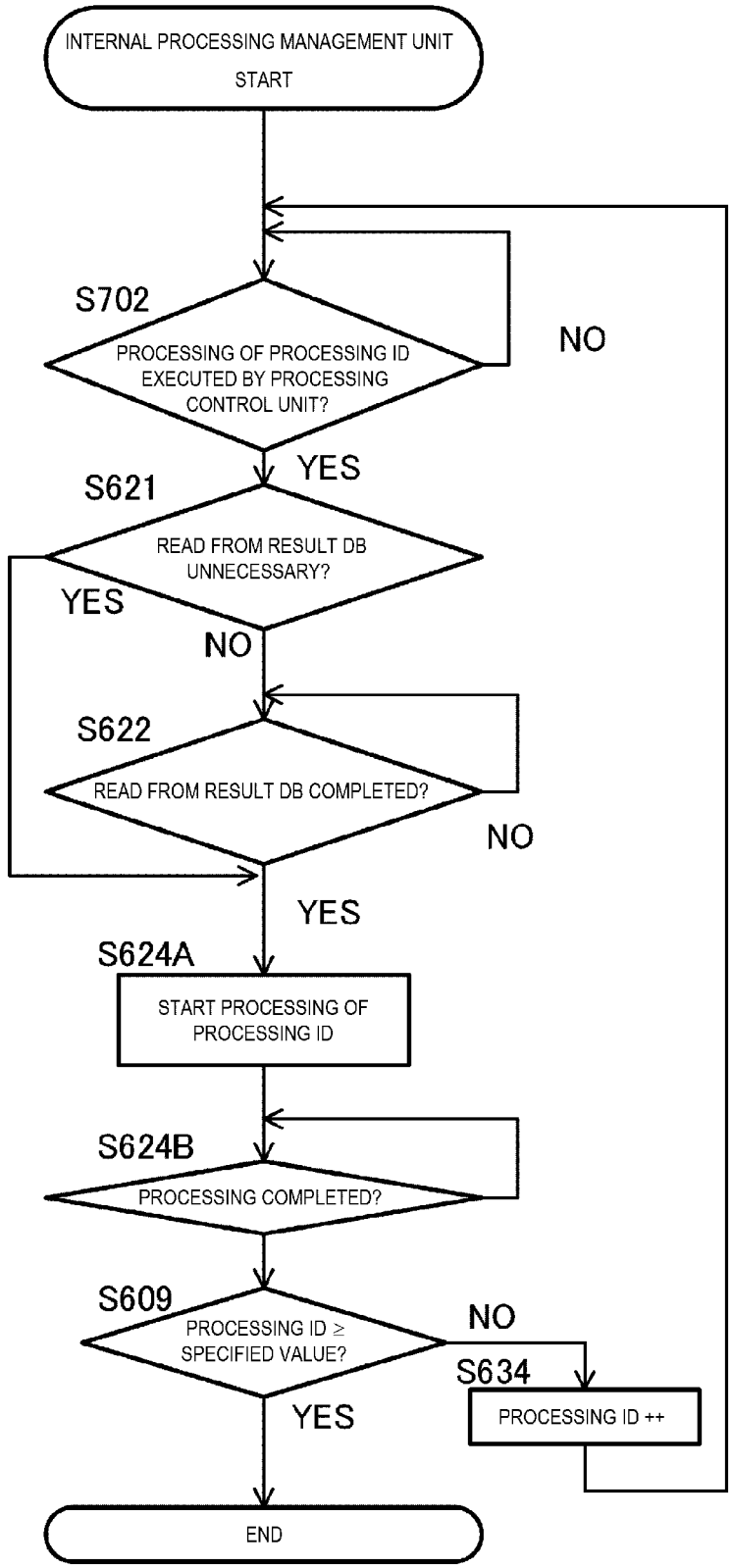

[FIG. 17]
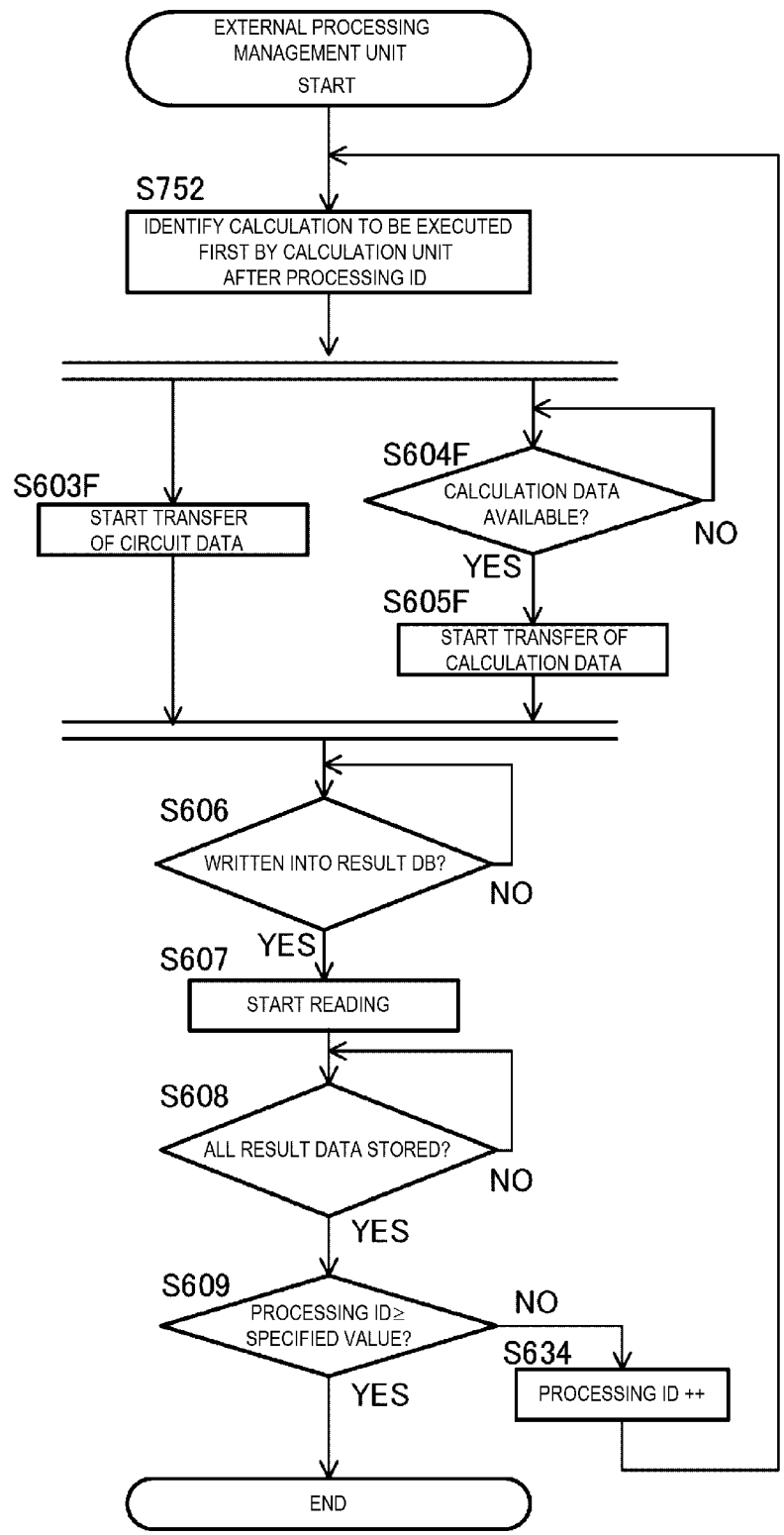

ELECTRONIC CONTROL DEVICE AND METHOD OF CONTROLLING LOGIC CIRCUIT

TECHNICAL FIELD

The present invention relates to an electronic control device and a method of controlling a logic circuit.

BACKGROUND ART

The technical development aimed at automatic driving of vehicles is in progress. In the automatic driving, it is necessary to recognize the surroundings and control the vehicle instead of the driver, and process a huge amount of information processing. In order to cope with the increasing information processing, the study using a hardware chip in addition to a CPU is in progress. Among the hardware chips, it is expected to implement a plurality of processing on one logic circuit using a Programmable Logic Device (PLD) such as a Field Programmable Gate Array (FPGA) capable of reconfiguring the logic circuit. When calculation is performed using the logic circuit, an appropriate processing is required taking into account the time required for the reconfiguration of the logic circuit.

PTL 1 discloses a programmable logic circuit device, which includes a programmable logic circuit unit including a circuit element and a configuration memory connected to the circuit element, in which a circuit is configured based on circuit information written into the configuration memory; a circuit information input control unit configured to receive a control signal from outside and write circuit information input from the outside into the configuration memory; a data cache unit configured to temporarily hold data processed in the circuit configured based on circuit information written into the configuration memory; an input data switching unit configured to perform switching control in accordance with a switching control signal from the outside so as to supply any one of data from the data cache unit and input data with respect to the circuit configured based on circuit information written into the configuration memory; and an output data switching unit configured to perform switching control in accordance with the switching control signal from the outside as to whether supply output data of the circuit configured based on circuit information written into the configuration memory to the data cache unit or derive the output data as output data.

PRIOR ART LITERATURE

Patent Literature

PTL 1: JP-A-2006-333496

SUMMARY OF INVENTION

Technical Problem

According to the invention described in PTL 1, the processing time cannot be shortened when discontinuous data is processed in a logic circuit to be reconfigured.

Solution to Problem

An electronic control device according to a first aspect of the invention includes: a partially reconfigurable logic circuit in which a calculation unit which is reconfigured and executes calculation and a storage unit which stores calculation target data to be calculated by the calculation unit are configured; and a processing control unit which transmits circuit data for reconfiguring the calculation unit and the calculation target data to the logic circuit, in which when the processing control unit obtains next calculation target data which is the calculation target data relating to a next calculation unit which is the calculation unit after completion of reconfiguration, transmission of the next calculation target data to the storage unit is started regardless of whether the reconfiguration of the next calculation unit is completed, and upon completion of the reconfiguration, the next calculation unit performs calculation using the next calculation target data.

A method of controlling a logic circuit according to a second aspect of the invention, which is a method of controlling the partially reconfigurable logic circuit in which a calculation unit which is reconfigured using circuit data to be transmitted and executes calculation and a storage unit which stores calculation target data to be calculated by the calculation unit is configured, includes: when next calculation target data which is the calculation target data relating to a next calculation unit which is the calculation unit after completion of reconfiguration is obtained, starting transmission of the next calculation target data to the storage unit regardless of whether the reconfiguration of the next calculation unit is completed; and upon completion of the reconfiguration, performing calculation using the next calculation target data by the next calculation unit.

Advantageous Effect

According to the invention, the processing time can be shortened when discontinuous data is processed in the logic circuit to be reconfigured.

BRIEF DESCRIPTION OF DRAWINGS

FIG. 1 is a system configuration diagram of an in-vehicle system 1.

FIG. 2 is a hardware configuration diagram of an autonomous traveling control device 2.

FIG. 3 is a functional configuration diagram of the autonomous traveling control device 2 according to a first embodiment.

FIG. 4 is a diagram showing an example of a processing information DB 3.

FIG. 5 is a diagram showing an example of calculation DB management information 211.

FIG. 6 is a diagram showing an example of result DB management information 212.

FIG. 7 is a diagram showing an example of state management information 213.

FIG. 8 is a flowchart showing an operation of a processing control unit 202 according to the first embodiment.

FIG. 9 is a flowchart showing an operation of a reconfiguration circuit 203.

FIG. 10 is a timing chart showing an operation of the autonomous traveling control device 2.

FIG. 11 is a timing chart showing a comparison with a related art.

FIG. 12 is a flowchart showing an operation of the processing control unit 202 according to a second modification.

FIG. 13 is a flowchart showing an operation of the processing control unit 202 according to a third modification.

FIG. 14 is a flowchart showing an operation of the processing control unit 202 according to a fourth modification.

FIG. 15 is a functional configuration diagram of the autonomous traveling control device 2 according to a second embodiment.

FIG. 16 is a flowchart showing an operation of an internal processing management unit 230.

FIG. 17 is a flowchart showing an operation of an external processing management unit 240.

DESCRIPTION OF EMBODIMENTS

First Embodiment

Hereinafter, a first embodiment of an autonomous traveling control device which is an electronic control device according to the invention will be described with reference to FIGS. 1 to 11.

<System Configuration>

FIG. 1 is a system configuration diagram of an in-vehicle system 1 which includes an autonomous traveling control device 2. The in-vehicle system 1 includes a camera information acquisition unit 101 which is mounted on a vehicle 100 to recognize an external situation of the vehicle 100 by a camera, a radar information acquisition unit 102 which recognizes the external situation of the vehicle 100 by a radar, and an own vehicle position information acquisition unit 103 which detects a position of the vehicle 100 using a satellite navigation system, for example, a GPS receiver. The in-vehicle system 1 further includes an automatic driving setting unit 104 which sets automatic driving of the vehicle 100, and a wireless communication unit 105 which updates information of the in-vehicle system 1 by an Over-The-Air (OTA).

The in-vehicle system 1 further includes an autonomous traveling control device 2, an auxiliary control unit 106, a brake control unit 107, an engine control unit 108, and a power steering control unit 109. The autonomous traveling control device 2, the auxiliary control unit 106, the brake control unit 107, the engine control unit 108, and the power steering control unit 109 are, for example, Electronic Control Units (ECU).

The camera information acquisition unit 101, the radar information acquisition unit 102, the own vehicle position information acquisition unit 103, the automatic driving setting unit 104, the wireless communication unit 105, the autonomous traveling control device 2, the auxiliary control unit 106, the brake control unit 107, the engine control unit 108, and the power steering control unit 109 are communicably connected to each other by an in-vehicle network of a Controller Area Network (CAN).

The camera information acquisition unit 101, the radar information acquisition unit 102, and the own vehicle position information acquisition unit 103 respectively transmit information received from a sensor or the like to the autonomous traveling control device 2. The automatic driving setting unit 104 transmits setting information such as a destination, a route, and a traveling speed during automatic driving to the autonomous traveling control device 2. However, a part of information transmitted by the automatic driving setting unit 104 may be received from an outside such as a server device 110 via the wireless communication unit 105.

The autonomous traveling control device 2 performs processing for automatic driving control, and outputs a control command to the brake control unit 107, the engine control unit 108, and the power steering control unit 109 based on a processing result. The auxiliary control unit 106 performs a similar control as the autonomous traveling control device 2 as an auxiliary. The brake control unit 107 controls a braking force of the vehicle 100. The engine control unit 108 controls a drive force of the vehicle 100. The power steering control unit 109 controls steering of the vehicle 100.

When the autonomous traveling control device 2 receives an automatic driving setting request from the automatic driving setting unit 104, a trajectory along which the vehicle 100 moves is calculated based on external information from the camera information acquisition unit 101, the radar information acquisition unit 102, the own vehicle position information acquisition unit 103, and the like. The autonomous traveling control device 2 outputs control commands such as the braking force, the drive force, and the steering to the brake control unit 107, the engine control unit 108, and the power steering control unit 109 so as to move the vehicle 100 according to the calculated trajectory. The brake control unit 107, the engine control unit 108, and the power steering control unit 109 receive the control commands from the autonomous traveling control device 2, and respectively output operation signals to an actuator to be controlled (not shown).

FIG. 2 is a hardware configuration diagram of the autonomous traveling control device 2. The autonomous traveling control device 2 includes a CPU 251, a ROM 252, a RAM 253, a flash memory 254, a logic circuit 255, and a communication interface 256. The CPU 251 implements a function to be described later by developing and executing a program stored in the ROM 252 in the RAM 253. The flash memory 254 is a non-volatile storage area. The CPU 251 may be a processor having a plurality of cores adopting a lockstep method.

The logic circuit 255 is a reconfigurable logic circuit using a Programmable Logic Device (PLD) such as a Field Programmable Gate Array (FPGA). The logic circuit 255 is a so-called partially reconfigurable logic circuit capable of reconfiguring only a part of the logic circuit 255. The communication interface 256 is an interface which communicates with a predetermined protocol such as a CAN. The autonomous traveling control device 2 is connected to another device via the communication interface 256 to transmit and receive data. However, the communication interface 256 may include two communication ports or may include only one communication port connected to an external device.

<Functional Configuration of Autonomous Traveling Control Device>

FIG. 3 is a functional configuration diagram of the autonomous traveling control device 2. The autonomous traveling control device 2 includes a first communication interface 201A, a second communication interface 201B, a processing control unit 202, a reconfiguration circuit 203, a reconfiguration management unit 204, a database management unit (hereinafter, referred to as a DB management unit) 205, a calculation unit 206, a processing information database (hereinafter, referred to as processing information DB) 3, a calculation database (hereinafter, referred to as a calculation DB) 4, a result database (hereinafter, referred to as a result DB) 5, and a circuit database (hereinafter, referred to as a circuit DB) 6. Hereinafter, the first communication interface 201A and the second communication interface 201B are collectively referred to as a "communication interface 201". The communication interface 201 is implemented by the communication interface 256 of FIG. 2. The processing information DB 3 and the circuit DB 6 are implemented by the flash memory 254.

The reconfiguration circuit 203 is implemented by the logic circuit 255. The reconfiguration management unit 204, the DB management unit 205, the calculation unit 206, the calculation DB 4, and the result DB 5 are configured in the reconfiguration circuit 203. According to the present embodiment, the reconfiguration circuit 203 does not reconfigure the reconfiguration management unit 204, the DB management unit 205, the calculation DB 4, and the result DB 5, but reconfigures only the calculation unit 206. In other words, the reconfiguration circuit 203 can be partially reconfigured, and reconfigures a circuit corresponding to the calculation unit 206 while maintaining a circuit of the calculation DB 4 or the like.

The autonomous traveling control device 2 is connected to, via the first communication interface 201A, the camera information acquisition unit 101, the radar information acquisition unit 102, the own vehicle position information acquisition unit 103, the automatic driving setting unit 104, the wireless communication unit 105, and connected to, via the second communication interface 201B, the auxiliary control unit 106, the brake control unit 107, the engine control unit 108, and the power steering control unit 109 in FIG. 1. In FIG. 3, the autonomous traveling control device 2 includes two logical communication interfaces of the first communication interface 201A and the second communication interface 201B, but may include only one logical communication interface having the functions of both the first communication interface 201A and the second communication interface 201B.

The processing control unit 202 is implemented by a program executed by the CPU 251. The processing control unit 202 includes state management information 213. The processing control unit 202 repeatedly executes processing to be described later at a predetermined processing cycle T while referring to and editing the state management information 213. The state management information 213 is implemented by the RAM 253 or the flash memory 254. The processing control unit 202 periodically collects sensor information from the camera information acquisition unit 101, the radar information acquisition unit 102, the own vehicle position information acquisition unit 103, or automatic driving setting information from the automatic driving setting unit 104. The processing control unit 202 refers to the processing information DB 3 to determine a number of times of processing to be performed and processing information with respect to the collected sensor information or the automatic driving setting information. The processing control unit 202 stores the state management information 213.

Based on the number of times of processing and the processing information determined by the processing information DB 3, the processing control unit 202 determines whether there is a calculation processing to be performed by the processing control unit 202 and whether there is a calculation processing to be performed by the calculation unit 206. When the calculation processing is executed by the calculation unit 206, the processing control unit 202 transmits a reconfiguration instruction 21 which includes circuit data to the reconfiguration circuit 203, and reconfigures a logic circuit of the calculation unit 206 via the reconfiguration management unit 204. In addition, when the calculation processing is performed by the calculation unit 206, the processing control unit 202 transmits calculation data 23 to the reconfiguration circuit 203, and stores data necessary for the calculation processing of the calculation unit 206 in the calculation DB 4 via the DB management unit 205.

The processing control unit 202 manages a state of reconfiguration of a circuit area of the calculation unit 206, a write state and a read state of the calculation DB 4, and a write state and a read state of the result DB 5, and adjusts the calculation processing performed by the processing control unit 202 and the timing of the calculation processing performed by the calculation unit 206. The processing control unit 202 outputs, based on a result of the calculation processing performed by the processing control unit 202 itself and result data 24 acquired from the DB management unit 205, the control command such as the braking force or the drive force to the communication interface 201B.

The reconfiguration management unit 204 receives the reconfiguration instruction 21 which includes processing circuit data from the processing control unit 202, and changes the logic circuit of the calculation unit 206 of the circuit area in the reconfiguration circuit 203. When the change of the logic circuit is completed, the reconfiguration management unit 204 notifies the processing control unit 202 of a reconfiguration completion notification 22.

The DB management unit 205 provides the processing control unit 202 and the calculation unit 206 with access to the calculation DB 4 and the result DB 5. For example, upon receiving the calculation data 23 from the processing control unit 202, the DB management unit 205 stores the calculation data 23 in the calculation DB 4, and provides data to the calculation unit 206. The DB management unit 205 stores a calculation result output by the calculation unit 206 in the result DB 5, and notifies the processing control unit 202 that the storage is started. The DB management unit 205 includes result DB management information 212 and calculation DB management information 211. The DB management unit 205 executes processing while referring to and editing the result DB management information 212 and the operation DB management information 211. Details will be described later. The result DB management information 212 and the calculation DB management information 211 are storage areas configured in the reconfiguration circuit 203.

The calculation DB 4 and the result DB 5 are storage areas configured in the reconfiguration circuit 203. Since the calculation DB 4 and the result DB 5 are configured in the same reconfiguration circuit 203 as the calculation unit 206, high-speed data can be input/output among the calculation DB 4, the result DB 5, and the calculation unit 206 compared with the processing control unit 202 which is present outside the reconfiguration circuit 203. For example, when the same data is read by the calculation unit 206, it takes less time for the calculation unit 206 to read from the calculation DB 4 than to read from the processing control unit 202. When data is read by the calculation unit 206 from the calculation DB 4, it is necessary to separately read data from the processing control unit 202 to the calculation DB 4, but the timing is devised as will be described later. In addition, when the same data is written by the calculation unit 206, it takes less time for the calculation unit 206 to write into the result DB 5 than to write into the processing control unit 202.

The circuit DB 6 stores a plurality of pieces of processing circuit data. These pieces of processing circuit data are written in the circuit area in the reconfiguration circuit 203 to form a logic circuit of the calculation unit 206 or the like.

The calculation unit 206 is reconfigured by the reconfiguration management unit 204, and executes a predetermined processing when the reconfiguration is completed. The predetermined processing executed by the calculation unit 206 is determined by the reconfigured circuit, in other words, by processing circuit data received by the reconfiguration management unit 204 from the processing control unit 202. The calculation unit 206 requests the DB management unit 205 to read the calculation data 23 stored in the calculation DB 4 and executes a predetermined processing using the acquired data. Further, the calculation unit 206 issues a write request to the DB management unit 205 such that the execution result of the predetermined processing is stored in the result DB 5.

When receiving the write request from the calculation unit 206, the DB management unit 205 stores the execution result in the result DB 5. Details of the result DB management information 212 of the DB management unit 205 will be described later with reference to FIG. 6. The processing control unit 202 acquires the execution result stored in the result DB 5 as the result data 24.

<Configuration Example of Processing Information Database>

FIG. 4 is a diagram showing an example of the processing information DB 3. The processing information DB 3 is a database which is referred to by the processing control unit 202 and stores processing content to be performed with respect to the collected sensor information or the automatic driving setting information are stored. The processing information DB 3 includes fields of a number of times of processing 301 and processing information 302. The number of times of processing 301 stores the sum of a number of times of calculations performed by the calculation unit 206 and a number of times of processing performed by the processing control unit 202. The processing information 302 includes a plurality of pieces of processing information, for example, processing information 1 to processing information 5. The processing information 302 stores a name of a processing and a name of a circuit of the calculation unit 206 corresponding to each processing. However, when the processing is executed by the processing control unit 202, "circuit: none" is stored.

For example, in the example shown in FIG. 4, "5" is stored in a field of the number of times 301, which indicates that the sum of the number of times of processing by the calculation unit 206 and the number of times of processing by the processing control unit 202 is 5. Information stored in the fields of the processing information 1 to the processing information 5 indicated by reference numerals 302-1 to 302-5 is as follows. The processing information 1 indicated by reference numeral 302-1 indicates that the calculation unit 206 is reconfigured using the processing circuit data corresponding to a logic circuit A in the circuit DB 6, and a calculation processing P1 is performed. The processing information 2 indicated by reference numeral 302-2 indicates that a calculation processing P2 is performed by the processing control unit. The processing information 3 indicated by reference numeral 302-3 indicates that the calculation unit 206 is reconfigured using the processing circuit data corresponding to a logic circuit B in the circuit DB 6, and a calculation processing P3 is performed. The processing information 4 indicated by reference numeral 302-4 indicates that a calculation processing P4 is performed by the processing control unit. The processing information 5 indicated by reference numeral 302-5 indicates that the calculation unit 206 is reconfigured using the processing circuit data corresponding to a logic circuit C in the circuit DB 6, and a calculation processing P5 is performed. The processing information DB 3 shown in FIG. 4 is an example, and the number of pieces of processing information which constitute the processing information 302 may be other than 3. That is, the processing information 302 may be composed of two pieces of processing information, or may be composed of four or more pieces of processing information.

In the present embodiment, in each calculation processing, the execution result of a predetermined processing is acquired based on the execution result of the immediately previous calculation processing. For example, in the calculation processing P1, calculation is performed based on the collected sensor information or the automatic driving setting information and an execution result is acquired, and in the calculation processing P2, a predetermined processing is executed based on the execution result of the calculation processing P1. Each of the calculation processing P3 to P5 executes a predetermined processing based on the execution result of each of the calculation processing P2 to P4. However, the calculation of each of the calculation processing P2 to P4 may be performed using information other than the execution result of the immediately previous calculation processing.

<Calculation Database Management Information>

FIG. 5 is a diagram showing an example of the calculation DB management information 211. The calculation DB management information 211 includes fields of a circuit type 401, a total calculation data number 402, a size of one piece of calculation data 403, a number of write data 404, and a number of read data 405. In the field of the circuit type 401, type information of the logic circuit which causes the calculation unit 206 to perform the processing is stored. In the field of the total calculation data number 402, the total number of calculation data necessary for the predetermined processing to be performed by the calculation unit 206 is stored. In the field of the size of one piece of calculation data 403, when a plurality of calculations is to be performed by the calculation unit 206, a data size to be used for one calculation is stored. In the field of the number of write data 404, the number of data written in the calculation DB 4 is stored. In the field of the number of read data 405, the number of data read from the calculation DB 4 is stored.

Information on the total number of pieces of calculation data stored in the field of the total calculation data number 402 may be transmitted together with the calculation data 23 by the processing control unit 202, or may be a value of the field of the number of write data 404 when the transmission of the calculation data 23 from the processing control unit 202 is completed. Upon receiving the calculation data 23 from the processing control unit 202, the DB management unit 205 stores the calculation data 23 in the calculation DB 4, and writes the number of the received calculation data 23 into the field of the number of write data 404. When the calculation data 23 is transmitted from the calculation DB 4 to the calculation unit 206, the DB management unit 205 writes the number of the transmitted calculation data 23 into the field of the number of read data 405.

A match between the value stored in the field of the number of write data 404 and a value stored in the field of the total calculation data number 402 indicates that all calculation data necessary for the processing of the calculation unit 206 is stored. Similarly, a match between a value stored in the field of the number of read data 405 and the value stored in the field of the total calculation data number 402 indicates that all calculation data is read. Although the detailed description is omitted, the number of write data 404 and the number of read data 405 are management pointers of addresses of the calculation DB 4.

For example, in the field of the circuit type 401, since the calculation unit 206 is configured with the logic circuit A when the processing control unit 202 executes the processing information 1 indicated by reference numeral 302-1 in FIG. 4, "A" is stored. In the field of the total calculation data number 402A, a total number of calculation data necessary for the calculation processing P1, for example, "1024" is stored. In the field of the size of one piece of calculation data 403, the size of one piece of data of the calculation processing P1, for example, "8 Byte" is stored. In addition, in the example shown in FIG. 5, since the value of the field of the number of write data 404 is "512", it is indicated that 512 pieces out of 1024 pieces of data in the total calculation data number 402 are written. Further, since the value of the field of the number of read data 405 is "0", it is indicated that no calculation data is read from the calculation unit 206.

<Result Database Management Information>

FIG. 6 is a diagram showing an example of the result DB management information 212. The result DB management information 212 includes fields of a circuit type 501, a total result data number 502, a size of one piece of result data 503, a number of write data 504, and a number of read data 505. In the field of the circuit type 501, type information of the logic circuit of the calculation unit 206 which acquires the execution result is stored. In the field of the total result data number 502, a total number of result data of the calculation unit 206 which executes a predetermined processing is stored. In the field of the size of one piece of result data 503, when a plurality of calculation results are acquired from the calculation unit 206, the size of the storage area necessary for storing one calculation result is stored. In the field of the number of write data 504, the number of data written in the result DB 5 is stored. In the field of the number of read data 505, the number of data read from the result DB 5 is stored.

The value of the field of the total result data number 502 may be transferred from the field of the total calculation data number 402 of the calculation DB management information 211 or separately from the processing control unit 202. Upon receiving the result data 24 from the calculation unit 206, the DB management unit 205 stores the result data 24 in the result DB 5 and writes the number of the received result data 24 into the field of the number of write data 504. When the result data 24 is transmitted to the processing control unit 202, the DB management unit 205 writes the number of the transmitted result data 24 into the field of the number of read data 505.

A match between a value stored in the field of the number of write data 504 and a value stored in the field of the total result data number 502 indicates that the processing of the calculation unit 206 is completed and all the calculation results are stored. Similarly, a match between a value stored in the field of the number of read data 505 and the value stored in the field of the total result data number 502 indicates that all calculation data is read. Although the detailed description is omitted, the number of write data 504 and the number of read data 505 are management pointers of addresses of the result DB 5.

For example, in the field of the circuit type 501, since the calculation unit 206 is configured with the logic circuit B when the processing control unit 202 executes the processing information 3 indicated by reference numeral 302-3 in FIG. 4, "B" is stored. In the field of the total result data number 502, a total number of calculation data necessary for the calculation processing P3, for example, "1024" is stored. In the field of the size of one piece of result data 503, the size of one calculation result of the calculation processing P3, for example, "4 Byte" is stored. In addition, in the example shown in FIG. 6, since the value of the field of the number of write data 504 is "1024", it is indicated that all result data is written. Further, since the value of the field of the number of read data 505 is "128", it is indicated that a part of result data is read.

<State Management Information>

FIG. 7 is a diagram showing an example of the state management information 213. The state management information 213 indicates the states of the calculation unit 206, the calculation DB 4, and the result DB 5. The state management information 213 includes fields of a circuit type 601 and a reconfiguration state 602 indicating a state of the calculation unit 206, a calculation type 603 and a calculation DB state 604 indicating a state of the calculation DB 4, a result type 605 and a result DB state 606 indicating a state of the result DB 5. In the field of the circuit type 601, type information of the logic circuit of the calculation unit 206 is stored. In the field of the reconfiguration state 602, a reconfiguration state of the calculation unit 206, that is, "completed" indicating completion of reconfiguration or "under reconfiguration" indicating that reconfiguration is in progress, is stored.

In the field of the calculation type 603, type information of the logic circuit for processing the calculation data 23 stored in the calculation DB 4 is stored. In the field of the calculation DB state 604, a value indicating a storage state of the calculation data 23 processed by the logic circuit identified by the value of the field of the calculation type 603 in the calculation DB 4 is stored. The value "stored" indicates that the storage is completed, or "in storage" indicates that storage is in progress or storage is not started. In the field of the result type 605, type information of the logic circuit in which the execution result stored in the result DB 5 is output is stored. In the field of the result DB state 606, a value indicating an acquisition state of the execution result processed by the logic circuit identified by the value of the field of the result type 605 from the result DB 5 is stored. The value "acquired" indicates that the processing control unit 202 acquires all the result data 24 from the result DB 5, or "stored" indicates that there is a result data 24 which is not acquired.

For example, in the example shown in FIG. 7, the fact that the calculation unit 206 is reconfigured with the logic circuit C is represented by a value "C" of the field of the circuit type 601 and a value "completed" of the field of the reconfiguration state 602. Values of the fields of the calculation type 603 and the calculation DB state 604 indicate that calculation data of the circuit type "C" is "in storage" in the calculation DB 4. Further, values of the fields of the result type 605 and the result DB state 606 indicate that the processing control unit 202 "acquired" all the calculation results of the circuit type "B".

<Flowchart of Processing Control Unit>

FIG. 8 is a flowchart showing an operation of the processing control unit 202. The execution subject of each step described below is the CPU 251 of the autonomous traveling control device 2. The processing control unit 202 executes the operations shown in the following flowchart for each predetermined processing cycle T.

In step S601, the processing control unit 202 assigns "1" to a processing ID which is a loop counter. In the next step S602, the processing control unit 202 refers to the processing information DB 3 and determines whether a processing of the processing information indicated by the processing ID uses a logic circuit. When it is determined that the logic circuit is to be used, the processing proceeds to step S603, and when it is determined that the logic circuit is not used, the processing proceeds to step S621. For example, when the processing information DB 3 is as shown in FIG. 4 and the processing ID is "1", the processing control unit 202 refers to the processing information 1 indicated by reference numeral 302-1. Then, the processing control unit 202 determines that the logic circuit is used because "circuit: A" is described.

In step S603, transfer of circuit data to the reconfiguration management unit 204 is started based on the description of the processing information DB 3. In step S603, only the start of transfer of circuit data is specified without confirming the end of transfer, in other words, immediately after the start of transfer of circuit data, the processing proceeds to the next step S604. Although not described in the flowchart, the reconfiguration management unit 204 immediately starts reconfiguration of the calculation unit 206 when circuit data is received. When the reconfiguration is completed, the calculation unit 206 acquires the calculation data from the calculation DB 4, executes the calculation, and writes the result data 24 into the result DB 5.

In the next step S604, it is determined whether calculation data is available, in other words, whether the immediately pervious processing is completed. When it is determined that the calculation data is available, the processing proceeds to step S605, and when it is determined that the calculation data is not yet available, after waiting for a predetermined time in step S631, step S604 is executed again. In the next step S605, calculation data is transferred to the DB management unit 205.

In the next step S606, it is determined whether there is a write in the result DB 5, in other words, whether the output of the result data 24 from the calculation unit 206 is started. When it is determined that there is a write, the processing proceeds to step S607, and when it is determined that there is no write yet, after waiting for a predetermined time in step S632, step S606 is executed again. In step S607, read of the result data 24 from the result DB 5 is started via the DB management unit 205. In the next step S608, it is determined whether all result data is stored in the result DB 5. As described above, the determination can be made based on whether the value of the field of the total result data number 502 matches the value of the field of the number of read data 505 in the result DB management information 212. When it is determined that all result data 24 is stored in the result DB 5, the processing proceeds to step S609, and when it is determined that there is unstored result data 24, after waiting for a predetermined time in step S633, step S608 is executed again.

In step S609, it is determined whether the processing ID is equal to or greater than a specified value, that is, the value of the field of the number of times of processing in the processing information DB 3. When it is determined that the processing ID is equal to or greater than the specified value, since all the processing shown in the processing information DB 3 is completed, the operation shown in FIG. 8 ends. When it is determined that the processing ID is less than the specified value, the processing proceeds to step S634, and the processing ID is incremented, and the processing returns to step S602.

In step S621, which is executed when a negative determination is made in step S602, it is determined whether read of the result data 24 from the result DB 5 is unnecessary in order to execute the processing indicated by the processing ID, with reference to the processing information DB 3. For example, when the processing in the processing control unit 202 is continuous or when the processing ID is "1", an affirmative determination is made in step S621. When an affirmative determination is made, the processing proceeds to step S624, and when a negative determination is made, the processing proceeds to step S622. In step S622, it is determined whether read of the result data 24 from the result DB 5 is completed. When it is determined that read is completed, the processing proceeds to step S624, and when it is determined that read is not completed, after waiting for a predetermined time in step S623, step S622 is executed again. The read processing waiting for completion in step S623 is the operation started in step S607.

In step S624, the processing control unit 202 executes the processing indicated by the processing ID, and then the processing proceeds to step S609.

<Flowchart of Reconfiguration Management Unit>

FIG. 9 is a flowchart showing an operation of the reconfiguration circuit 203. As will be described below, the reconfiguration circuit 203 is operated by a cooperative operation of the reconfiguration management unit 204, the DB management unit 205, and the calculation unit 206. Each time the reconfiguration circuit 203 receives circuit data from the processing control unit 202, the reconfiguration circuit 203 performs an operation shown in the following flowchart.

In step S800, the reconfiguration management unit 204 starts writing the received circuit data to the reconfiguration circuit 203, that is, starts reconfiguration of the calculation unit 206. In the next step S801, the reconfiguration management unit 204 determines whether the reconfiguration of the calculation unit 206 in the reconfiguration circuit 203 is completed. When it is determined that the processing is completed, the processing proceeds to step S802, and when it is determined that the processing is not completed, the processing returns to step S801. In step S802, the reconfiguration management unit 204 notifies the processing control unit 202 that the reconfiguration is completed. In the next step S803, the DB management unit 205 determines whether calculation data is stored in the calculation DB 4. When it is determined that the calculation data is stored, the processing proceeds to step S804, and when it is determined that the calculation data is not stored, step S803 is executed again. In step S804, the calculation unit 206 acquires calculation data from the calculation DB 4, executes the processing, and stores the processing result in the result DB 5. This is the end of the processing.

<Timing Chart>

FIG. 10 is a timing chart showing an operation at a certain processing cycle T of the autonomous traveling control device 2. In the example shown in FIG. 10, the processing control unit 202 is operated with reference to the processing information DB 3 described in FIG. 4. In FIG. 10, time elapses from the left to the right in the drawing. As shown at a left end of FIG. 10, FIG. 10 shows, from above, an operation state of the processing control unit 202, values of the fields 601 to 606 of the state management information 213, a transmission state of the reconfiguration instruction 21, a transmission state of the reconfiguration completion notification 22, a transmission state of the calculation data 23, input/output of the calculation DB 4, an operation of calculation unit 206, input/output of the result DB 5, and a transmission state of the result data 24.

At time point t0, the processing control unit 202 starts a periodic processing and interprets the number of times of processing 301 and processing information 302 with reference to the processing information DB 3. FIG. 10 shows only one cycle of time T, but the processing is repeatedly executed.

At time point t1 when the interpretation is completed, the processing control unit 202 transmits the processing circuit data of the processing information 1 indicated by reference numeral 302-1 in FIG. 4, that is, the logic circuit A, the reconfiguration instruction 21 to the calculation unit 206, to the reconfiguration management unit 204. Accordingly, the calculation unit 206 is under reconfiguration. The processing control unit 202 writes the calculation data 23 necessary for the calculation processing P1 in the calculation DB 4. By writing the calculation data 23 into the calculation DB 4 under reconfiguration, the execution of the calculation processing P1 after the completion of the reconfiguration is prepared. At this time, the processing control unit 202 stores "A" in the circuit type 601 of the state management information 213 shown in FIG. 7, "under reconfiguration" in the reconfiguration state 602, "A" in the calculation type 603, and "in storage" in the calculation DB state 604.

At time point t2, when write of the calculation data 23 into the calculation DB 4 is completed, the processing control unit 202 changes the calculation DB state 604 to "already been set".

At time point t3, when the transmission of the circuit data of the logic circuit A is ended and the reconfiguration of the calculation unit 206 is completed, the reconfiguration management unit 204 transmits the reconfiguration completion notification 22 to the processing control unit 202. In addition, the processing control unit 202 changes the reconfiguration state 602 to "completed". Upon completion of the reconfiguration, the calculation unit 206 confirms that data necessary for the calculation processing P1 is stored in the calculation DB 4, and starts executing the calculation processing P1 while reading data from the calculation DB 4 via the DB management unit 205. Since read of data from the calculation DB 4 to the calculation unit 206 is configured in the same reconfiguration circuit 203, the read of data can be performed in a short time.

At time point t4, the calculation unit 206 which executes the calculation processing P1 starts storing the execution result in the result DB 5 via the DB management unit 205. The processing control unit 202 changes the result type 605 to "A" and the result DB state 606 to "stored". The processing control unit 202 starts read of the result DB 5 via the DB management unit 205, and acquires the result data 24 of the calculation processing P1. Since write of data from the calculation unit 206 to the result DB 5 is configured in the same reconfiguration circuit 203, the write of data is completed in a short time.

At time point t5, write of the result data of the calculation unit 206 to the result DB 5 is completed. That is, since the processing of the calculation unit 206 is completed, the processing control unit 202 starts transmitting the next circuit data, that is, the processing circuit data of the processing information 3 indicated by reference numeral 302-3 in FIG. 3, that is, the circuit data of the logic circuit B. The processing control unit 202 further transmits the reconfiguration instruction 21 to the calculation unit 206 to the reconfiguration management unit 204. Accordingly, the calculation unit 206 is under reconfiguration again. At this time, the processing control unit 202 changes the circuit type 601 to "B" and the reconfiguration state 602 to "under reconfiguration".

At time point t6, the processing control unit 202 completes the read of the result data 24 of the calculation processing P1 from the result DB 5, and changes the result DB state 606 to "acquired". Then, the processing control unit 202 starts the execution of the calculation processing P2.

At time point t7, when the transmission of the circuit data of the logic circuit B is finished and the reconfiguration of the calculation unit 206 is completed, the reconfiguration management unit 204 transmits the reconfiguration completion notification 22 to the processing control unit 202. Then, the reconfiguration state 602 is changed to "completed". However, since the calculation data to be processed by the logic circuit B is not yet obtained during the execution of the processing information 2, the calculation in the calculation unit 206 is not yet started.

At time point t8, when the processing control unit 202 completes execution of the calculation processing P2, the processing control unit 202 writes the calculation data 23 necessary for the calculation processing P3 into the calculation DB 4. At this time, the processing control unit 202 changes the calculation type 603 to "B" and the calculation DB state 604 to "in storage". At time point t7, since the reconfiguration of the calculation unit 206 to the logic circuit B is completed, the calculation unit 206 confirms that data necessary for the calculation processing P3 is stored in the calculation DB 4, and starts executing the calculation processing P3 while reading data from the calculation DB 4 via the DB management unit 205.

At time point t9, when write of the calculation data 23 into the calculation DB 4 is completed, the processing control unit 202 changes the calculation DB state 604 to "already been set". Since data can be read from the calculation DB 4 to the calculation unit 206 in a short time, the read is completed at the same time point t9.

At time point t10, the calculation unit 206 which executes the calculation processing P3 starts storing the execution result in the result DB 5 via the DB management unit 205. At this time, read of the result data 24 from the result DB 5 by the processing control unit 202 is also started. The processing control unit 202 changes the result type 605 to "B" and the result DB state 606 to "stored".

At time point t11, when the write of the execution result into the result DB 5 is completed, the processing control unit 202 transmits the circuit data of the logic circuit C and the reconfiguration instruction 21 to the reconfiguration management unit 204 so as to configure the next calculation unit 206. In the period from time point t10 to time point t11, the write into the result DB 5 is completed, but since the processing control unit 202 exists outside the reconfiguration circuit 203, the read from the result DB 5 is not completed and continues at time point t11. The processing control unit 202 changes the circuit type 601 to "C" and the reconfiguration state 602 to "under reconfiguration".

At time point t12, the processing control unit 202 completes the read of the result data 24 of the calculation processing P3 from the result DB 5, and changes the result DB state 606 to "acquired". Then, the processing control unit 202 starts the execution of the calculation processing P4.

At time point t13, when the processing control unit 202 completes execution of the calculation processing P4, the processing control unit 202 writes the calculation data 23 necessary for the next calculation processing P5 into the calculation DB 4. At this time, the calculation unit 206 continues the reconfiguration, and writes the calculation data 23 into the calculation DB 4 in parallel with the reconfiguration, so as to prepare to start the execution of the calculation processing P5 after the reconfiguration is completed. At this time, the processing control unit 202 changes the calculation type 603 to "C" and the calculation DB state 604 to "in storage".

At time point t14, when the transmission of the circuit data of the logic circuit C and the reconfiguration of the calculation unit 206 are completed, the reconfiguration management unit 204 transmits the reconfiguration completion notification 22 to the processing control unit 202. The processing control unit 202 changes the reconfiguration state 602 to "completed". Upon completion of the reconfiguration, the calculation unit 206 confirms that data necessary for the calculation processing P5 is stored in the calculation DB 4, and starts executing the calculation processing P5 while reading data from the calculation DB 4 via the DB management unit 205.

At time point t15, when write of the calculation data 23 into the calculation DB 4 is completed, the processing control unit 202 changes the calculation DB state 604 to "already been set". Since read of data from the calculation DB 4 to the calculation unit 206 can be performed in a short time, the read is completed at the same time point t15.

At time point t16, the calculation unit 206 which executes the calculation processing P5 starts storing the execution result in the result DB 5 via the DB management unit 205. At this time, read of the result data 24 from the result DB 5 by the processing control unit 202 is also started. The processing control unit 202 changes the result type 605 to "C" and the result DB state 606 to "stored".

At time point t17, the write of the execution result into the result DB 5 is completed. At time point t17, the read from the result DB 5 is not completed and continues.

At time point t18, the processing control unit 202 completes the read of the result data 24 of the calculation processing P5 from the result DB 5, and changes the result DB state 606 to "acquired". In addition, the processing control unit 202 outputs a control command based on the result data 24 of the calculation processing P5. At time point t19, the output of the control command is completed, and the processing control unit 202 ends the processing for one cycle of time T.

<Comparison with Related Art>

FIG. 11 is a timing chart showing a comparison between the autonomous traveling control device 2 according to the first embodiment and an autonomous traveling control device according to related art (hereinafter, a related autonomous traveling control device). The related autonomous traveling control device does not include the calculation DB 4 and the result DB 5. A related calculation unit receives calculation data directly from a related processing control unit, and directly outputs the result data. FIG. 11 is divided into an upper half and a lower half by time information illustrated slightly below the middle of the drawing. In the upper half of FIG. 11, some elements shown in FIG. 10 are shown as they are. The lower half of FIG. 11 shows operation timings of a processing control unit according to related art (hereinafter, related processing control unit) and a calculation unit according to related art (related calculation unit) in the related autonomous traveling control device. However, here, the related autonomous traveling control device is also operated according to the description of the processing information DB 3 shown in FIG. 4.

From time point t0 to time point t1, the related calculation unit interprets the number of times of processing 301 and the processing information 302 with reference to the processing information DB 3 in a similar manner as the processing control unit 202. From time point t1 to time point t3, the related calculation unit performs reconfiguration. Then, at time point t3 when the reconfiguration is completed, the related calculation unit starts the calculation of P1. After time point t3, the related calculation unit receives calculation data from the related processing control unit and performs the calculation. Then, the related calculation unit outputs result data obtained by the calculation to the related processing control unit.

Since the related calculation unit receives calculation data from the processing control unit outside the reconfiguration circuit 203, the calculation unit 206 requires a longer time for reading the calculation data from the calculation DB 4. Similarity applies to the output of result data of the related calculation unit. Therefore, although the calculation unit 206 and the related calculation unit perform the same processing, time required for input/output differs, so the required time differs. Specifically, time point t6A at which the related calculation unit ends output of calculation data of the calculation processing P1 is later than time point t6 at which the processing control unit 202 finishes the read of all data from the result DB 5.

At time point 6A, the related processing control unit starts the calculation processing P2. Time required for the processing is the same as the time required for the calculation processing P2 by the processing control unit 202. At time point t8A, since the related processing control unit completes the calculation processing P2, the related calculation unit starts reconfiguration for the next calculation processing P3. Time point t8A is later than time point t8 at which the calculation unit 206 starts the calculation processing P3. At time point t10A, the reconfiguration of the related calculation unit is completed, and the related calculation unit starts the calculation processing P3. The related calculation unit performs calculation while acquiring calculation data from the related processing control unit in a similar manner as the calculation processing P1, and outputs result data to the related processing control unit. Therefore, time required for the calculation processing P3 by the related calculation unit is longer than time required for the calculation processing P3 by the calculation unit 206.

In this way, since the calculation unit 206 is equivalent to a wide bandwidth which can be used for input/output compared with the related calculation unit, even when the same processing is performed, the processing is completed in a short time. Since the calculation unit 206 starts reconfiguration for the next processing as soon as the immediately previous processing of the calculation unit 206 is completed, it takes a short time from the completion of the immediately previous calculation until the calculation unit 206 starts operating.

According to the first embodiment described above, the following operational effects are obtained.

(1) The autonomous traveling control device 2 includes the partially reconfigurable reconfiguration circuit 203 in which the calculation unit 206 which is reconfigured and executes calculation and the calculation DB 4 which stores calculation target data by the calculation unit 206 is configured, and the processing control unit 202 which transmits circuit data for reconfiguring the calculation unit 206 and calculation data to the calculation DB 4 of the reconfiguration circuit 203. For example, when calculation data relating to the calculation processing P1 is obtained, the processing control unit 202 starts transmitting calculation data to the calculation DB 4 regardless of whether the reconfiguration of the calculation unit 206 is completed. The calculation unit 206 performs calculation using calculation data stored in the calculation DB 4.

Since the calculation DB 4 is configured in the same reconfiguration circuit 203 as the calculation unit 206, the transfer of calculation data from the calculation DB 4 to the calculation unit 206 is completed in a shorter time than the data transfer from the processing control unit 202 directly to the calculation unit 206. Since the processing control unit 202 starts transmitting calculation data to the calculation DB 4 before completion of the reconfiguration of the calculation unit 206, time for the calculation unit 206 to read calculation data by reading calculation data from the calculation DB 4 can be shortened. That is, since the autonomous traveling control device 2 has the above configuration, when the processing control unit 202 and the calculation unit 206 perform processing for the discontinuous data alternately, the processing time can be shortened. As can be seen from the comparison with the related example shown in FIG. 11, the autonomous traveling control device 2 improves the utilization efficiency of the reconfiguration circuit 203.

(2) When next calculation target data by the calculation unit 206 is generated by, for example, the calculation processing P2 in the processing control unit 202, and when the calculation processing P2 in the processing control unit 202 is completed, the processing control unit 202 determines that next calculation target data can be obtained by the calculation unit 206.

(3) When the processing control unit 202 is capable of transmitting both circuit data and calculation data to the reconfiguration circuit 203, in FIG. 8, since S603 is executed before S605, circuit data is preferentially transmitted to the reconfiguration circuit 203. As shown at t8 in FIG. 10, the calculation of the calculation unit 206 can be started without storing all calculation data in the calculation DB 4. However, unless all circuit data is completely transmitted to the reconfiguration circuit 203, the calculation of the calculation unit 206 cannot be started. Therefore, circuit data is preferentially transmitted to the reconfiguration circuit 203 rather than the calculation data, and the calculation of the calculation unit 206 can be started early.

(4) A case where circuit data is capable of being transmitted to the reconfiguration circuit 203 is a case where the calculation in the calculation unit 206 is completed. A case where calculation target data is capable of being transmitted to the reconfiguration circuit 203 is a case where all calculation data is read from the calculation DB 4 and next calculation target data is obtained.

(5) The result DB 5 which stores the calculation result of the calculation unit 206 is configured in the reconfiguration circuit 203. When the calculation result of the calculation unit 206 is stored in the result DB 5, the processing control unit 202 transmits circuit data for reconfiguration of the calculation unit 206. Since the result DB 5 is configured in the same reconfiguration circuit 203 as the calculation unit 206, data transfer from the calculation unit 206 to the result DB 5 is completed in a shorter time than data transfer from the result DB 5 to the processing control unit 202. Therefore, compared with the case where result data is transferred from the calculation unit 206 to the processing control unit 202, the reconfiguration of the calculation unit 206 can be started earlier.

(First Modification)

The processing control unit 202 determines the availability of calculation data when the transfer of circuit data is started in step S603 in FIG. 8, and immediately starts the transfer of calculation data when calculation data is available. That is, in the above embodiment, the transfer of calculation data may be started immediately after the transfer of circuit data is started. However, the transfer of calculation data may be started under the condition that a predetermined time elapses from the start of transfer of circuit data.

(Second Modification)

The processing control unit 202 may start transmission of circuit data and transmission of calculation data substantially simultaneously.

FIG. 12 is a flowchart showing the operation of the processing control unit 202 according to the second modification instead of FIG. 8 according to the above embodiment. However, FIG. 12 mainly describes the differences from FIG. 8, and the omitted parts are similar to the operations in FIG. 8. Steps in which the same processing is performed as in FIG. 8 are given the same step numbers.

When an affirmative determination is made in step S602, the processing control unit 202 starts processing in step S603A and processing in S604A in parallel. In step S603A, the processing control unit 202 starts the transfer of circuit data. In step S604A, when the processing control unit 202 makes an affirmative determination, the processing control unit 202 performs the processing in step S605A. When processing in step S603A and processing in step S605A are completed, the processing control unit 202 starts the processing in step S606.

According to the second modification, the transmission of circuit data and the transmission of calculation data are started substantially simultaneously, and the transfer of calculation data to the calculation DB 4 can be completed as soon as possible.

(Third Modification)

When the processing control unit 202 is capable of transmitting both circuit data and calculation data, based on time required for the subsequent processing, it may be determined whether to give priority to transmission of circuit data or transmission of calculation target data.

FIG. 13 is a flowchart showing the operation of the processing control unit 202 according to the third modification instead of FIG. 8 according to the above embodiment. However, FIG. 13 mainly describes the differences from FIG. 8, and the omitted part is similar to the operations of FIG. 8. Steps in which the same processing is performed as in FIG. 8 are given the same step numbers.

When an affirmative determination is made in step S602 by the processing control unit 202, the processing proceeds to step S604B. In step S604B, the processing control unit 202 determines whether calculation data is available. When an affirmative determination is made, the processing proceeds to step S641, and when a negative determination is made, the processing proceeds to step S603C. In step S641, the processing control unit 202 determines whether time from the start of transfer of circuit data to the reconfiguration management unit 204 to the completion of reconfiguration of the calculation unit 206 is shorter than time required for transfer calculation data to the calculation DB 4. When it is determined that the former time is shorter than the latter time, the processing proceeds to step S605B, and when it is determined that the latter time is shorter than the former time, the processing proceeds to step S603D. In step S605B, the transfer of the calculation data is started, and in the next step S643, there is a predetermined time for waiting. Standby time in step S643 is, for example, the difference between time from the start of transfer of circuit data to the reconfiguration management unit 204 to the completion of reconfiguration of the calculation unit 206 and time required for transfer of calculation data to the calculation DB 4. In the next step S603B, transfer of circuit data is started, and the processing proceeds to step S606.

In step S603C, which is executed when a negative determination is made in step S604B, the processing control unit 202 starts transfer of circuit data, and the processing proceeds to step S604A. In step S603D, which is executed when a negative determination is made in step S641, transfer of circuit data is started, and the processing proceeds to step S642. In step S642, after waiting for a predetermined time, the processing proceeds to step S604A. The standby time in step S643 is, for example, the difference between time from the start of transfer of circuit data to the reconfiguration management unit 204 to the completion of reconfiguration of the calculation unit 206 and time required for transfer of calculation data to the calculation DB 4. That is, in this case, the completion of the reconfiguration of the calculation unit 206 and the completion of the transfer of the calculation data are substantially simultaneous.

In step S604A, the processing control unit 202 determines again whether calculation data is available, and when a negative determination is made, the processing control unit 202 waits in step S631A and then executes step S604A again. When an affirmative determination is made in step S604A, the processing proceeds to step S605C. In step S605C, the transfer of calculation data is started, and the processing proceeds to step S606. Since the processing after step S606 is similar to that of the first embodiment, the description thereof is omitted.

When the reconfiguration of the calculation unit 206 is completed in a shorter time than the transfer of circuit data or the like, or when the transfer of the circuit data and the reconfiguration of the calculation unit 206 can be executed simultaneously as shown in the timing chart of FIG. 10, the flowchart described above may be modified as follows. That is, in step S641 and step S642, instead of the time from the start of transfer of the circuit data to the reconfiguration management unit 204 until the completion of the reconfiguration of the calculation unit 206, time required for the transfer of circuit data to the reconfiguration management unit 204 may be evaluated. In step S643, the standby time may be determined such that the completion of the transfer of calculation data is completed earlier than the completion of the reconfiguration of the calculation unit 206. Further, in step S643, the standby time may be determined such that the transmission of the subsequent data is started at the timing when the transfer of data which is transmitted first is completed.

According to the third modification, in addition to the operational effects in the first embodiment, the following operational effects are obtained.

(1) When the processing control unit 202 is capable of transmitting both circuit data and calculation target data to the reconfiguration circuit 203, based on time required for the transmission of circuit data and time required for the transmission of calculation target data, it is determined whether to give priority to transmission of circuit data or transmission of calculation target data. Therefore, data requiring a long transfer time can be transmitted first, and time from the completion of the reconfiguration of the calculation unit 206 to the start of calculation can be shortened.

(2) Based on time required for the transmission of circuit data and time required for the transmission of calculation target data, the processing control unit 202 determines one of circuit data and calculation target data is first transmission data to be transmitted first, and the other is post-transmission data, determines post-transmission standby time based on the difference between time required for the transmission of circuit data and time required for the transmission of calculation target data, transmits post-transmission data after only waiting for the post-transmission standby time after transmitting the first transmission data. Therefore, circuit data and calculation data can be efficiently transmitted.

(3) The processing control unit 202 determines the post-transmission standby time such that the completion of the reconfiguration of the calculation unit 206 and the completion of the transfer of calculation data to the calculation DB 4 are simultaneously performed. Therefore, time from the completion of the reconfiguration of the calculation unit 206 to the start of calculation can be shortened.

(Fourth Modification)

When both circuit data and calculation data is capable of being transmitted, the processing control unit 202 may preferentially transmit calculation data based on time required for the subsequent processing.

FIG. 14 is a flowchart showing the operation of the processing control unit 202 according to the fourth modification instead of FIG. 8 according to the above embodiment. Steps in which the same processing is performed as in FIG. 8 are given the same step numbers.

The processing of steps S601 and S602 is similar to that in FIG. 8, and a description thereof will be omitted. When an affirmative determination is made in step S602, the processing control unit 202 executes step S608A and step S651 in parallel. The processing when a negative determination is made in step S602 is similar to that in the first embodiment, and a description thereof will be omitted.

In step S608A, the processing control unit 202 determines whether all result data is stored in the result DB 5, that is, whether the calculation of the calculation unit 206 is completed. When it is determined that the calculation of the calculation unit 206 is completed, the processing proceeds to step S603E, and when it is determined that the calculation of the calculation unit 206 is not completed, step S608A is executed again. However, there is a predetermined standby time before executing step S608A. When a processing ID is "1", an affirmative determination is made in step S608A. In step S603E, the processing control unit 202 starts transfer of circuit data.

In step S651, the processing control unit 202 determines whether calculation data is read from the calculation DB 4. It can be determined whether the read of calculation data is completed based on, in the calculation DB management information 211, whether the value of the field of the total calculation data number 402 matches the value of the field of the number of read data 405. When an affirmative determination is made in step S651, the processing proceeds to step S604B, and when a negative determination is made in step S651, step S651 is executed again. However, there is a predetermined standby time before executing step S651. When the processing ID is "1", an affirmative determination is made in step S651. In step S604B, it is determined whether calculation data used by the calculation processing indicated by the processing ID is available. When it is determined that data can be obtained, the processing proceeds to step S605E to start transfer of calculation data, and when it is determined that calculation data is not yet available, step S604B is executed again.

When both step S603E and step S605E are executed, the processing control unit 202 executes step S606. Upon executing step S606 and step S607, the processing control unit 202 executes step S609. Since the processing in step S609 and the processing in step S634 executed when a negative determination is made in step S609 are the similar to those in the first embodiment, a description thereof will be omitted.

(Fifth Modification)

When processing is continuously performed in the calculation unit 206, result data stored in the result DB 5 may be input to the next configured calculation unit 206 without being transferred to the processing control unit 202. In that case, the calculation DB 4 and the result DB 5 can correspond to each other by temporarily interchanging the roles. For example, a case where a calculation processing Q1 and a calculation processing Q2 are continuously processed in the calculation unit 206 will be described as an example. The calculation unit 206 stores the calculation result of the calculation processing Q1 in the result DB 5. When all the calculation results of the calculation processing Q1 are stored in the result DB 5, the calculation unit 206 starts reconfiguration to execute the calculation processing Q2. When the reconfiguration is completed, the calculation unit 206 starts reading result data of the calculation processing Q1 from the result DB 5, that is, calculation data of the calculation processing Q2. Then, the calculation unit 206 outputs the calculation result of the calculation processing Q2 to calculation DB 4. According to the fifth modification, since data is cached in the reconfiguration circuit 203 when processing is continuously performed in the calculation unit 206, part of read and write by the processing control unit 202 can be omitted, and processing can be speeded up.

Second Embodiment

With reference to FIGS. 15 to 17, a second embodiment of an autonomous traveling control device which is an electronic control device according to the invention will be described. In the following description, the same components as those in the first embodiment are denoted by the same reference numerals, and different points will be mainly described. The points not specifically described are the same as those of the first embodiment. The present embodiment is different from the first embodiment in that a processing control unit mainly includes an internal processing management unit which manages calculation processing in the processing control unit 202 and an external processing management unit which manages calculation processing in a reconfiguration circuit.

<Functional Configuration of Autonomous Traveling Control Device>

FIG. 15 is a functional configuration diagram of the autonomous traveling control device 2 according to the second embodiment. The difference from the first embodiment is that the processing control unit 202 further includes an internal processing management unit 230 and an external processing management unit 240. The internal processing management unit 230 and the external processing management unit 240 are implemented by the CPU 251 executing a program stored in the ROM 252. The internal processing management unit 230 and the external processing management unit 240 share information of a processing ID, and either one of the internal processing management unit 230 and the external processing management unit 240 changes a value of a processing ID, and the value of the processing ID is also changed for the other.

<Flowchart of Internal Processing Management Unit>

FIG. 16 is a flowchart showing an operation of the internal processing management unit 230. The internal processing management unit 230 executes an operation shown in the following flowchart for each predetermined processing cycle T. Steps in which the same processing is performed as in FIG. 8 are given the same step numbers. In the following, differences from FIG. 8 will be mainly described. The execution subject of the steps shown in the flowchart described below is the CPU 251. Immediately before starting the flowchart shown in FIG. 16, "1" is assigned to the processing ID by the processing control unit 202.

In step S702, the internal processing management unit 230 refers to the processing information DB 3, and determines whether the processing in the processing information indicated by the processing ID is executed by the processing control unit 202. An affirmative determination is made when a circuit is set to "none" in the processing information indicated by the processing ID, and a negative determination is made when the circuit is set otherwise. When an affirmative determination is made by the internal processing management unit 230, the processing proceeds to step S621, and when a negative determination is made by the internal processing management unit 230, step S702 is executed again. When a negative determination is made in step S702, the processing waits for the processing ID to be updated by the external processing management unit 240.

The processing after step S621 is similar to that in the first embodiment. When it is determined in step S609 that the processing ID is equal to or greater than a specified value, that is, a value of the field of a number of times of processing in the processing information DB 3, the operation shown in FIG. 16 ends.

<Flowchart of External Processing Management Unit>

FIG. 17 is a flowchart showing an operation of the external processing management unit 240. The external processing management unit 240 executes the operation shown in the following flowchart for each predetermined processing cycle T. Steps in which the same processing is performed as in FIG. 8 are given the same step numbers. In the following, differences from FIG. 8 will be mainly described. The execution subject of the steps shown in the flowchart described below is the CPU 251. Immediately before starting the flowchart shown in FIG. 17, "1" is assigned to the processing ID by the processing control unit 202.

In step S752, the external processing management unit 240 refers to the processing information DB 3, and identifies the calculation to be executed first by the calculation unit 206 in the processing after the processing for the value of the processing ID. For example, when the processing ID is "2" and the processing information DB 3 is as shown in FIG. 4, "P3" is identified. Since the processing information 2 is recorded as "circuit: none", the calculation P2 is not executed by the calculation unit 206, and the next calculation P3 in the processing information 3 is recorded as "circuit: B". When the processing of step S752 is completed, the external processing management unit 240 executes the processing of step S603F and the processing of step S604F in parallel.

In step S603F, the external processing management unit 240 starts transfer of circuit data corresponding to the calculation identified in step S752. In step S604F, the external processing management unit 240 determines whether calculation data used in the calculation identified in step S752 is available. When it is determined that calculation data is available, the processing proceeds to step S605F, and when it is determined that calculation data is not yet available, step S604F is executed again. When a negative determination is made in step S604F, the processing waits for the calculation of the internal processing management unit 230 to be completed. In step S605F, the external processing management unit 240 starts transfer of calculation data used in the calculation identified in step S752 to the calculation DB 4.

When the executions of both step S603F and step S605F are completed, the external processing management unit 240 executes step S606. Since the processing from step S606 to step S609 is similar to that of the first embodiment, a description thereof is omitted. When a negative determination is made in step S609, the processing ID is incremented, that is, "1" is increased, and the processing returns to step S752.

According to the second embodiment described above, the following operation and effect are obtained.

(1) The processing control unit 202 includes the internal processing management unit 230 and the external processing management unit 240. The internal processing management unit 230 and the external processing management unit 240 execute processing in parallel. The external processing management unit 240 identifies calculation which is first executed by the calculation unit 206 after the current processing ID. Then, the external processing management unit 240 starts the transfer of circuit data, and determines whether calculation next calculation target data is available in the calculation unit 206 and starts transfer of calculation data when calculation data is available.

Therefore, even when the processing in the processing control unit 202 is performed twice or more after the processing in the calculation unit 206, and when the processing in the calculation unit 206 is completed, transmission of circuit data for reconfiguration of the calculation unit 206 can be started.

Although the program executed by the autonomous traveling control device 2 is stored in the ROM 252, the program may be stored in the flash memory 254. The autonomous traveling control device 2 may include an input/output interface (not shown). A program may be read from another device via the input/output interface and a medium which can be used by an ECU 1 when necessary. Here, the medium refers to, for example, a storage medium which can be attached to and detached from the input/output interface, or a communication medium, that is, a wired, a wireless, or an optical network, or a carrier wave or a digital signal which propagates through the network.

The above embodiments and modifications may be combined with each other. Although various embodiments and modifications are described above, the invention is not limited to these contents. Other embodiments conceivable within the scope of the technical idea of the invention are also included in the scope of the invention.

The disclosure content of the following priority basic application is incorporated herein by reference.

Japanese Patent Application No. 2017-085365 (filed on Apr. 24, 2017).

REFERENCE SIGN LIST

1: in-vehicle system
2: autonomous traveling control device
3: processing information database
4: calculation database
5: result database
6: circuit database
21: reconfiguration instruction
22: reconfiguration completion notification
23: calculation data
24: result data
202: processing control unit
203: reconfiguration circuit
204: reconfiguration management unit
205: database management unit
206: calculation unit
211: calculation database management information
212: result database management information
213: state management information
230: internal processing management unit
240: external processing management unit

The invention claimed is:

1. An electronic control device, comprising:
a partially reconfigurable logic circuit in which both a calculation unit which is reconfigured and executes calculation and a storage unit which stores calculation target data to be calculated by the calculation unit are configured; and
a processing control unit which transmits circuit data for reconfiguring the calculation unit and the calculation target data to the logic circuit, wherein
when the processing control unit obtains next calculation target data which is the calculation target data relating to a next calculation unit which is the calculation unit after completion of reconfiguration, transmission of the next calculation target data to the storage unit is started regardless of whether the reconfiguration of the next calculation unit is completed, and
upon completion of the reconfiguration, the next calculation unit performs calculation using the next calculation target data.

2. The electronic control device according to claim 1, wherein
when the next calculation target data is generated by a processing of other than the calculation unit, and when the processing is completed, the processing control unit determines that the next calculation target data is obtained.

3. The electronic control device according to claim 1, wherein
when the processing control unit is capable of transmitting both the circuit data and the calculation target data to the logic circuit, the circuit data is preferentially transmitted to the logic circuit.

4. The electronic control device according to claim 1, wherein
when the processing control unit is capable of transmitting both the circuit data and the calculation target data to the logic circuit, based on circuit data transfer time which is time required for transmission of the circuit data to the logic circuit, and calculation data transfer time which is time required for transmission of the calculation target data to the logic circuit, the processing control unit determines one of the circuit data and the calculation target data is first transmission data to be transmitted first, and the other is post-transmission data to be transmitted later.

5. The electronic control device according to claim 4, wherein
the processing control unit determines post-transmission standby time based on a difference between the circuit data transfer time and the calculation data transfer time, and
the processing control unit transmits the post-transmission data after only waiting for the post-transmission standby time after transmitting the first transmission data.

6. The electronic control device according to claim 5, wherein
the processing control unit determines the post-transmission standby time such that transmission of the circuit data and transmission of the calculation target data are simultaneously completed.

7. The electronic control device according to claim 3, wherein
a case where the circuit data is capable of being transmitted to the logic circuit is a case where the calculation in the calculation unit is completed, and a case where the calculation target data is capable of being transmitted to the logic circuit is a case where all calculation target data is read from the storage unit and the next calculation target data is obtained.

8. The electronic control device according to claim 1, wherein
a result storage unit which stores a calculation result of the calculation unit is further configured in the logic circuit, and
when the calculation result of the calculation unit is stored in the result storage unit, the processing control unit starts to transmit the circuit data for reconfiguration of the calculation unit.

9. A method of controlling a partially reconfigurable logic circuit in which both a calculation unit which is reconfigured using circuit data to be transmitted and executes calculation and a storage unit which stores calculation target data to be calculated by the calculation unit are configured, the method comprising:
when next calculation target data which is the calculation target data relating to a next calculation unit which is the calculation unit after completion of reconfiguration is obtained, starting transmission of the next calculation target data to the storage unit regardless of whether the reconfiguration of the next calculation unit is completed; and
upon completion of the reconfiguration, performing calculation using the next calculation target data by the next calculation unit.

10. The method of controlling the logic circuit according to claim 9, wherein
when the next calculation target data is generated by a processing of other than the calculation unit, and when the processing is completed, determining that the next calculation target data is obtained.

11. The method of controlling the logic circuit according to claim 9, wherein
when both the circuit data and the calculation target data is capable of being transmitted to the logic circuit, preferentially transmitting the circuit data to the logic circuit.

12. The method of controlling the logic circuit according to claim 9, wherein
when both the circuit data and the calculation target data is capable of being transmitted to the logic circuit, based on circuit data transfer time which is time required for transmission of the circuit data to the logic circuit, and calculation data transfer time which is time required for transmission of the calculation target data to the logic circuit, determining one of the circuit data and the calculation target data is first transmission data to be transmitted first, and the other is post-transmission data to be transmitted later.

13. The method of controlling the logic circuit according to claim 12, further comprising:
determining post-transmission standby time based on a difference between the circuit data transfer time and the calculation data transfer time; and
transmitting the post-transmission data after only waiting for the post-transmission standby time after transmitting the first transmission data.

14. The method of controlling the logic circuit according to claim 11, wherein
a case where the circuit data is capable of being transmitted to the logic circuit is a case where the calculation in the calculation unit is completed, and
a case where the calculation target data is capable of being transmitted to the logic circuit is a case where all calculation target data is read from the storage unit and the next calculation target data is obtained.

15. The method of controlling the logic circuit according to claim 9, further comprising:
further configuring a result storage unit which stores a calculation result of the calculation unit in the logic circuit; and
when the calculation result of the calculation unit is stored in the result storage unit, transmitting the circuit data for reconfiguration of the calculation unit.

* * * * *